(12) United States Patent
Okuda

(10) Patent No.: US 10,069,468 B2
(45) Date of Patent: Sep. 4, 2018

(54) AUDIO SIGNAL AMPLIFICATION DEVICE, POWER SUPPLY DEVICE, AND POWER SUPPLY CONTROL METHOD

(71) Applicant: Panasonic Intellectual Property Management Co., Ltd., Osaka (JP)

(72) Inventor: Tadayoshi Okuda, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 15/511,052

(22) PCT Filed: Dec. 24, 2015

(86) PCT No.: PCT/JP2015/006420
§ 371 (c)(1),
(2) Date: Mar. 14, 2017

(87) PCT Pub. No.: WO2016/103696
PCT Pub. Date: Jun. 30, 2016

(65) Prior Publication Data
US 2017/0279420 A1    Sep. 28, 2017

(30) Foreign Application Priority Data
Dec. 24, 2014  (JP) ................... 2014-261216

(51) Int. Cl.
*H03F 3/217*  (2006.01)
*H03F 1/26*  (2006.01)
(Continued)

(52) U.S. Cl.
CPC .......... *H03F 3/217* (2013.01); *G10K 11/002* (2013.01); *H03F 1/26* (2013.01); *H03F 1/30* (2013.01);
(Continued)

(58) Field of Classification Search
CPC ... H03F 1/26; H03F 3/217; H03F 1/30; H03F 3/181; H03F 2200/03; H03F 2200/321;
(Continued)

(56) References Cited

U.S. PATENT DOCUMENTS 5,532,572 A    7/1996  Okamura
6,064,857 A *  5/2000  Wiedeman ............... H04B 1/56
455/127.1

(Continued)

FOREIGN PATENT DOCUMENTS

| JP | 10-150722 | 6/1998 |
|---|---|---|
| JP | 2007-258836 | 10/2007 |
| JP | 2011-188447 | 9/2011 |

OTHER PUBLICATIONS

International Search Report of PCT application No. PCT/JP2015/006420 dated Feb. 9, 2016.
(Continued)

*Primary Examiner* — Jason R Kurr
(74) *Attorney, Agent, or Firm* — McDermott Will & Emery LLP

(57) ABSTRACT

An audio signal amplification device includes: a clock generation circuit that generates a clock for use in amplifying an audio signal; and a power supply circuit that generates direct current power, which is supplied to the clock generation circuit, from input power. The power supply circuit includes: a constant voltage generation circuit that generates direct current power of a constant voltage from the input power; a first capacitor; a first charging circuit that charges the first capacitor by using the input power; and a selection circuit. The selection circuit selects one direct current power of the direct current power generated in the constant voltage generation circuit and of direct current power charged to the
(Continued)

first capacitor, and supplies the selected direct current power to the clock generation circuit.

11 Claims, 8 Drawing Sheets

(51) Int. Cl.
*G10K 11/00* (2006.01)
*H04R 3/04* (2006.01)
*H03F 1/30* (2006.01)
*H03F 3/181* (2006.01)
*H03L 1/00* (2006.01)
*H04R 3/00* (2006.01)

(52) U.S. Cl.
CPC .............. *H03F 3/181* (2013.01); *H03L 1/00* (2013.01); *H04R 3/04* (2013.01); *H03F 2200/03* (2013.01); *H03F 2200/321* (2013.01); *H03F 2200/351* (2013.01); *H03F 2200/511* (2013.01); *H04R 3/00* (2013.01)

(58) Field of Classification Search
CPC ......... H03F 2200/351; H03F 2200/511; G10K 11/002; H04R 3/04; H04R 3/00
USPC ...................................................... 381/94.1
See application file for complete search history.

(56) References Cited

U.S. PATENT DOCUMENTS

| 8,378,723 | B1 | 2/2013 | Atesoglu | |
| 2008/0111423 | A1* | 5/2008 | Baker | H02J 7/022 307/64 |
| 2009/0108681 | A1* | 4/2009 | Litovsky | H03F 1/0238 307/110 |
| 2011/0115427 | A1* | 5/2011 | Morita | H02J 7/34 320/107 |
| 2011/0156819 | A1* | 6/2011 | Kim | H02M 3/07 330/296 |
| 2013/0021096 | A1 | 1/2013 | Sugawara et al. | |
| 2015/0171795 | A1 | 6/2015 | Sugawara et al. | |

OTHER PUBLICATIONS

The Extended European Search Report dated Dec. 7, 2017 for the related European Patent Application No. 15872267.8.

* cited by examiner

AUDIO SIGNAL AMPLIFICATION DEVICE, POWER SUPPLY DEVICE, AND POWER SUPPLY CONTROL METHOD

This application is a U.S. national stage application of the PCT International Application No. PCT/JP2015/006420 filed on Dec. 24, 2015, which claims the benefit of foreign priority of Japanese patent application 2014-261216 filed on Dec. 24, 2014, the contents all of which are incorporated herein by reference.

TECHNICAL FIELD

The present disclosure relates to an audio signal amplification device, a power supply device, and a power supply control method.

BACKGROUND ART

Patent Literature 1 discloses an audio signal amplification device that amplifies an audio signal and the like.

As the audio signal amplification device, there is known a D-class amplifier with a little loss, which is capable of reducing power consumption. Moreover, there is known an audio signal amplification device including a clock generation circuit that generates a clock for use in amplifying the audio signal. In such an audio signal amplification device as described above, noise generated in a power supply circuit that supplies electric power to the clock generation circuit sometimes propagates to the clock generation circuit. Then, when the audio signal is amplified based on the clock generated by the clock generation circuit affected by the noise, distortion of an output signal is increased, causing a deterioration of an S/N ratio (Signal-to-Noise ratio) in some cases.

CITATION LIST

Patent Literature

PTL 1: Unexamined Japanese Patent Publication No. 2011-188447

SUMMARY

The present disclosure provides an audio signal amplification device, a power supply device, and a power supply control method, which are capable of suppressing propagation of noise to an instrument, which is to be supplied with electric power, for example, such as a clock generation circuit.

An audio signal amplification device of the present disclosure includes: a clock generation circuit that generates a clock for use in amplifying an audio signal; and a power supply circuit that generates direct current power, which is supplied to the clock generation circuit, from input power. The power supply circuit includes: a constant voltage generation circuit that generates direct current power of a constant voltage from the input power; a first capacitor; a first charging circuit that charges the first capacitor by using the input power; and a selection circuit. The selection circuit selects one direct current power of the direct current power generated in the constant voltage generation circuit and of direct current power charged to the first capacitor, and supplies the selected direct current power to the clock generation circuit.

A power supply device of the present disclosure includes: a constant voltage generation circuit that generates direct current power of a constant voltage from input power; a first capacitor; a first charging circuit that charges the first capacitor by using the input power; and a selection circuit. The selection circuit selects one direct current power of the direct current power generated in the constant voltage generation circuit and of direct current power charged to the first capacitor, and outputs the selected direct current power.

A power supply control method of the present disclosure is a power supply control method for controlling a power supply device that supplies power to an instrument. The power supply device controlled by the power supply control method includes: a constant voltage generation circuit that generates direct current power of a constant voltage from input power; a first capacitor; a first charging circuit that charges the first capacitor by using the input power; and a selection circuit that selects one direct current power of the direct current power generated in the constant voltage generation circuit and of direct current power charged to the first capacitor, and supplies the selected direct current power to the instrument. In the power supply control method, when power is supplied to the power supply device, the selection circuit is controlled so that the direct current power generated in the constant voltage generation circuit is selected in the selection circuit and is supplied to the instrument, and the first charging circuit is controlled so that the first capacitor is charged by the first charging circuit. Moreover, when a charging voltage of the first capacitor reaches a predetermined threshold value after the power is supplied to the power supply device, the selection circuit is controlled so that the direct current power charged to the first capacitor is selected in the selection circuit and is supplied to the instrument.

The audio signal amplification device, power supply device, and power supply control method of the present disclosure can suppress the propagation of the noise to the instrument, which is to be supplied with electric power, for example, such as a clock generation circuit.

DESCRIPTION OF EMBODIMENTS

Figure 1:
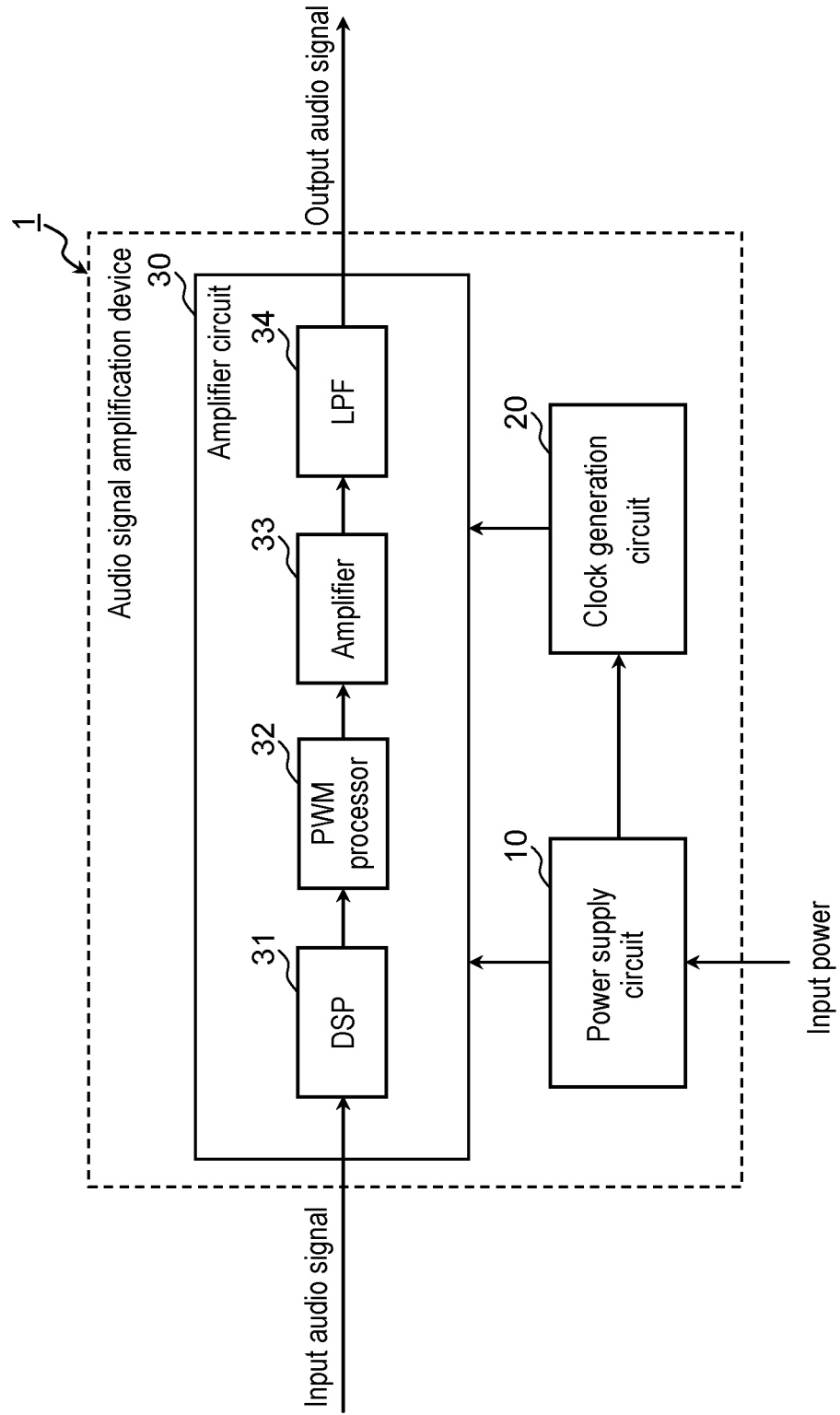
FIG. 1 is a block diagram schematically showing a configuration example of an audio signal amplification device in a first exemplary embodiment.

A description is made below in detail of exemplary embodiments while referring to the drawings as appropriate. However, a description more in detail than necessary is omitted in some cases. For example, a detailed description of a well-known item and a duplicate description of substantially the same configurations are omitted in some cases. These omissions are made in order to avoid unnecessary redundancy of the following description and to facilitate the understanding of those skilled in the art.

Note that the accompanying drawings and the following description are provided in order to allow those skilled in the art to fully understand the present disclosure, and it is not intended to thereby limit the subject of the description of the scope of claims.

Moreover, the respective drawings are schematic views, and are not illustrated necessarily exactly. Furthermore, in the respective drawings, the same reference numerals are assigned to the same constituent elements.

First Exemplary Embodiment

A description is made below of a first exemplary embodiment with reference to FIG. 1 to FIG. 5.

[1-1. Configuration]

FIG. 1 is a block diagram schematically showing a configuration example of audio signal amplification device 1 in the first exemplary embodiment.

Audio signal amplification device 1 in this exemplary embodiment is an audio signal amplification device that amplifies an audio signal. Audio signal amplification device 1 includes power supply circuit 10, clock generation circuit 20, and amplifier circuit 30.

Power supply circuit 10 is a circuit that receives input power, which is supplied from a power supply (not shown) such as an alternating current power supply and a direct current power supply, and generates direct current power supplied to clock generation circuit 20 and amplifier circuit 30. Details of power supply circuit 10 will be described later.

Clock generation circuit 20 is a circuit that generates a clock taken as a reference in an event of amplifying the audio signal. Clock generation circuit 20 generates a clock for use in operations of amplifier circuit 30, which will be described later. For example, in PWM (Pulse Width Modulation) processor 32 provided in amplifier circuit 30, PWM processing is performed by using a clock of a predetermined frequency. The PWM processing refers to processing in which an audio signal is converted into a pulse signal having a predetermined pulse width. Then, clock generation circuit 20 generates the clock of the predetermined frequency. Clock generation circuit 20 can be realized by a publicly known circuit that generates a clock, and accordingly, a detailed description of clock generation circuit 20 is omitted.

Amplifier circuit 30 is a circuit that receives the audio signal (illustrated as "input audio signal" in FIG. 1), which is converted from an analog signal to a digital signal by an A/D (Analog to Digital) converter (not shown), and amplifies and outputs the received audio signal. Amplifier circuit 30 includes DSP (Digital Signal Processor) 31, PWM processor 32, amplifier 33, and LPF (Low Pass Filter) 34.

DSP 31 implements acoustic treatment for the input audio signal. For example, DSP 31 performs acoustic treatment such as a conversion of a sample rate of the audio signal and an adjustment of frequency characteristics. DSP 31 can be realized by a publicly known digital signal processor, and accordingly, a detailed description of DSP 31 is omitted. Moreover, the acoustic treatment executed in DSP 31 is substantially same treatment as publicly known acoustic treatment, and accordingly, a detailed description of the acoustic treatment executed in DSP 31 is omitted.

PWM processor 32 converts the audio signal, which is subjected to the acoustic treatment in DSP 31, by PWM processing into a pulse signal having a predetermined pulse width. Specifically, PWM processor 32 generates a PWM signal having a duty ratio corresponding to a strength of the audio signal. The PWM processing executed in PWM processor 32 is substantially same as publicly known PWM processing, and accordingly, a detailed description of the PWM processing executed in PWM processor 32 is omitted.

For example, amplifier 33 is composed of switching elements connected to two upper and lower stages, a drive circuit that drives these switching elements individually, and the like. For example, each of the switching elements may be a MOSFET (Metal Oxide Semiconductor Field Effect Transistor), or may be other element having a switching function. The switching elements on the two upper and lower stages alternately repeat ON and OFF by the drive circuit, whereby amplifier 33 amplifies an amplitude of the PWM signal output from PWM processor 32. Amplifier 33 can be realized by a publicly known signal amplifier circuit, and accordingly, a detailed description of amplifier 33 is omitted.

LPF 34 is a low-pass filter composed of a coil, a capacitor and the like. From the pulse signal in which the amplitude is amplified by amplifier 33, a carrier frequency component (high frequency component) included in the PWM signal is substantially removed in such a manner that a high frequency band is filtered in LPF 34, whereby the pulse signal is demodulated to an analog signal. LPF 34 can be realized by a publicly known low-pass filter circuit, and accordingly, a detailed description of LPF 34 is omitted.

In such a way, the PWM signal in which the amplitude is amplified by amplifier 33 is demodulated to such an analog signal with a signal strength corresponding to the duty ratio of the PWM signal. The audio signal (written as "output audio signal" in FIG. 1) demodulated to the analog signal by LPF 34 is output, for example, to a speaker (not shown) and the like.

In such a way, audio signal amplification device 1 amplifies the audio signal (input audio signal) input to audio signal amplification device 1.

Figure 2:
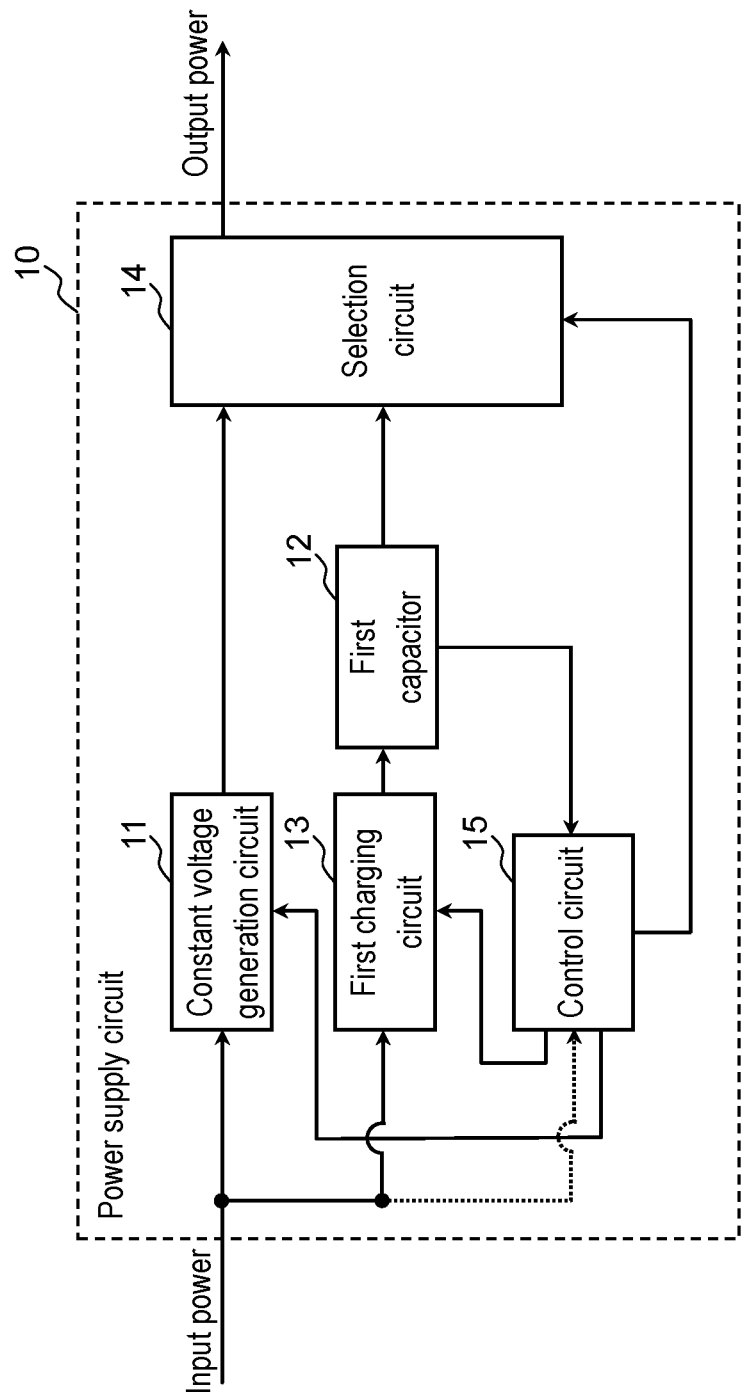
FIG. 2 is a block diagram schematically showing a configuration example of a power supply circuit in the first exemplary embodiment.

Next, a description is made of details of power supply circuit 10 with reference to FIG. 2.

FIG. 2 is a block diagram schematically showing a configuration example of power supply circuit 10 in the first exemplary embodiment. Note that FIG. 2 shows a configuration regarding electric power supplied to clock generation circuit 20, and a configuration regarding electric power supplied to amplifier circuit 30 is omitted.

Power supply circuit 10 includes constant voltage generation circuit 11, first capacitor 12, first charging circuit 13, selection circuit 14, and control circuit 15.

Constant voltage generation circuit 11 is a circuit that generates direct current power of a constant voltage from input power, which is supplied from the power supply (not shown), by stabilizing the input power. For example, constant voltage generation circuit 11 may be a regulator.

Constant voltage generation circuit 11 operates by receiving a signal, which indicates an instruction to actuate constant voltage generation circuit 11, from control circuit 15 to be described later, and generates direct current power. Moreover, at a time of not receiving the signal, which indicates the instruction to actuate constant voltage generation circuit 11, from control circuit 15, or at a time of receiving a signal, which indicates an instruction to stop the operations of constant voltage generation circuit 11, constant voltage generation circuit 11 stops operating, and does not generate the direct current power. For example, constant voltage generation circuit 11 can be realized by a publicly known constant voltage power generation circuit such as a regulator, and accordingly, a detailed description of constant voltage generation circuit 11 is omitted.

First capacitor 12 has a capacitor charged by first charging circuit 13. For example, the capacitor which first capacitor 12 has is an electric double layer capacitor; however, may be other type of capacitor.

Note that, in this exemplary embodiment, a fact that the capacitor which first capacitor 12 has is charged is written as "first capacitor 12 is charged" for a sake of convenience.

First charging circuit 13 is a circuit that charges first capacitor 12 by using the input power supplied from the power supply (not shown). Details of first capacitor 12 and first charging circuit 13 will be described later.

Selection circuit 14 is a circuit that selects and outputs one direct current power from two kinds of the direct current power, which are the direct current power generated by constant voltage generation circuit 11 and direct current power charged to first capacitor 12. For example, the direct current power output from selection circuit 14 is supplied to clock generation circuit 20. Upon receiving a signal, which indicates an instruction to select one of constant voltage generation circuit 11 and first capacitor 12, from control circuit 15 to be described later, selection circuit 14 selects and outputs the direct current power of either constant voltage generation circuit 11 or first capacitor 12 based on the received signal.

For example, upon receiving such a signal, which indicates an instruction to select first capacitor 12, from control circuit 15, selection circuit 14 supplies the direct current power, which is charged to first capacitor 12, to clock generation circuit 20. Moreover, upon receiving such a signal, which indicates an instruction to select constant voltage generation circuit 11, from control circuit 15, selection circuit 14 supplies the direct current power, which is generated in constant voltage generation circuit 11, to clock generation circuit 20. For example, selection circuit 14 can be realized by a publicly known 2-input 1-output circuit (or a multi-input 1-output circuit) using a transistor switch, and accordingly, a detailed description of selection circuit 14 is omitted.

Control circuit 15 is a circuit configured so as to control constant voltage generation circuit 11, first charging circuit 13 and selection circuit 14. For example, control circuit 15 can be realized by: a publicly known microcomputer; a program (software for the microcomputer) created so as to cause the microcomputer to execute operations of controlling respective circuits as control targets based on a flowchart to be described later; and a publicly known storage medium (or a storage device) in which the program is stored. Hence, a detailed description regarding a configuration of control circuit 15 is omitted. Note that control circuit 15 may be realized by other circuit (for example, a semiconductor integrated circuit or the like) configured so as to perform similar operations.

Moreover, control circuit 15 includes an A/D converter (not shown), and is configured so as to be capable of converting a charging voltage of first capacitor 12 into a digital signal by using the A/D converter, and to detect the charging voltage of first capacitor 12. Note that control circuit 15 does not have to include the A/D converter. For example, control circuit 15 may be configured so as to convert the charging voltage of first capacitor 12 by the A/D converter, which is provided outside of control circuit 15, into a digital signal, to receive the digital signal output from the A/D converter, and to thereby detect the charging voltage of first capacitor 12.

Figure 3:
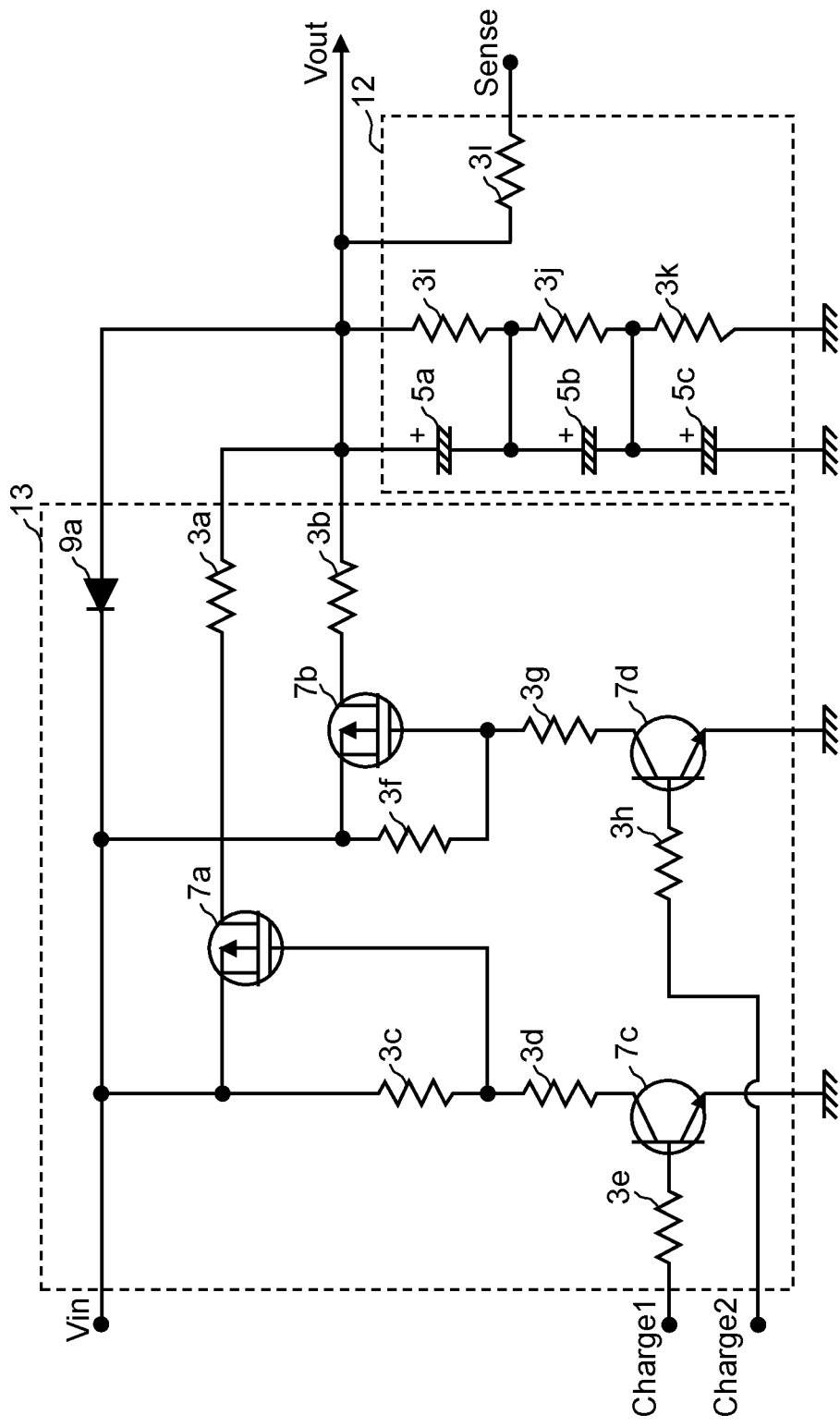
FIG. 3 is a circuit diagram showing a configuration example of a first charging circuit and a first capacitor in the first exemplary embodiment.

Next, a description is made of details of first capacitor 12 and first charging circuit 13 with reference to FIG. 3.

FIG. 3 is a circuit diagram showing a configuration example of first charging circuit 13 and first capacitor 12 in the first exemplary embodiment.

As shown in FIG. 3, first charging circuit 13 includes resistors 3a, 3b, 3c, 3d, 3e, 3f, 3g, and 3h, transistors 7a, 7b, 7c, and 7d, and diode 9a. Moreover, first capacitor 12 includes resistors 3i, 3j, 3k, and 3l, and capacitors 5a, 5b, and 5c. Then, first charging circuit 13 and first capacitor 12 are configured in such a manner that circuit elements of first charging circuit 13 and first capacitor 12 are arranged as illustrated in FIG. 3 and are connected to one another.

Note that, for example, transistors 7a and 7b are Pch-MOSFET (P channel Metal Oxide Semiconductor Field Effect Transistor), and for example, transistors 7c and 7d are NPN bipolar transistors. However, transistors 7a, 7b, 7c, and 7d are never limited to these configurations, and may be other types of transistors.

For example, capacitors 5a, 5b, and 5c provided in first capacitor 12 are electric double layer capacitors. The electric double layer capacitors have a relatively large charging amount; however, meanwhile, have a relatively low withstand voltage, and further, also have a relatively low chargeable voltage. However, in a circuit in which a plurality of the electric double layer capacitors are connected in series, the withstand voltage and the chargeable voltage can be relatively enhanced. Accordingly, in power supply circuit 10, three electric double layer capacitors (that is, capacitors 5a, 5b, and 5c) connected in series to one another are provided in first capacitor 12. Note that "first capacitor 12 is charged" in this exemplary embodiment" stands for that capacitors 5a, 5b, and 5c are charged.

Resistors 3i, 3j, and 3k provided in first capacitor 12 are resistors provided so that an appropriate charging voltage can be applied to first capacitor 12.

To first charging circuit 13, there are input: input power (written as Vin in FIG. 3) supplied from the power supply (not shown); and Signal Charge1 and Signal Charge2, which are transmitted from control circuit 15. Signal Charge1 and Signal Charge2 are signals which indicate an instruction to charge first capacitor 12 to first charging circuit 13. The input power supplied from the power supply (not shown) is power of Voltage Vin.

First charging circuit 13 can charge first capacitor 12 in two types of charging modes in which charging speeds are different from each other. Note that "charging speed" for use in the following description stands for an amount of a current for charging, which flows through a charging capacitor (for example, first capacitor 12), and "charging speed is fast (high-speed charging)" stands for that the amount of the current for charging is relatively large, and "charging speed is slow (low-speed charging)" stands for that the amount of the current for charging is relatively small.

Signal Charge1 is a signal, which indicates an instruction to charge first capacitor 12 in the charging mode in which the charging speed is relatively slow (hereinafter, referred to as "low-speed charging mode"). Signal Charge2 is a signal, which indicates an instruction to charge first capacitor 12 in the charging mode in which the charging speed is relatively fast (hereinafter, referred to as "high-speed charging mode"). In this exemplary embodiment, Signal Charge1 is also referred to as "signal indicating an instruction to perform low-speed charge". Moreover, Signal Charge2 is also referred to as "signal indicating an instruction to perform high-speed charge". In power supply circuit 10 shown in this exemplary embodiment, two charging modes which are the low-speed charging mode and the high-speed charging mode are provided in first charging circuit 13, whereby first capacitor 12 can be charged while switching the two charging modes and adjusting the amount of the current flowing through first charging circuit 13. In such a way, in power supply circuit 10, first capacitor 12 can be charged at a higher speed (that is, in a shorter time) while suppressing a load applied to first charging circuit 13.

When Signal Charge1 is at a H (High) level and Signal Charge2 is at a L (Low) level, power supply circuit 10 charges first capacitor 12 in the low-speed charging mode, and first capacitor 12 is subjected to the low-speed charge (that is, is charged with a relatively low amount of a current).

A specific description is made of operations at this time. When Signal Charge1 is at the H level, transistor 7c conducts (hereinafter, also referred to as "turns on"). By a fact that transistor 7c turns on, transistor 7a turns on. Meanwhile, when Signal Charge2 is at the L level, transistor 7d turns to a non-conduction state (hereinafter, also referred to as "turns off"). By a fact that transistor 7d turns off, transistor 7b turns off. By a fact that transistor 7a turns on and transistor 7b turns off, first capacitor 12 is charged with an amount of a current, which corresponds to Voltage Vin of the input power input to first charging circuit 13 and corresponds to resistor 3a. That is to say, first capacitor 12 is charged with an amount of a current, which corresponds to a magnitude of a resistance value of resistor 3a. In first charging circuit 13, resistor 3a is set to a resistance value larger than that of resistor 3b to be described later. In such a way, an amount of the current flowing through first capacitor 12 can be made relatively small. Hence, when Signal Charge1 is at the H level and Signal Charge2 is at the L level, first charging circuit 13 turns to a charging mode in which the charging speed is relatively slow (that is, the low-speed charging mode), and first capacitor 12 is charged at a relatively slow charging speed (that is, a relatively small amount of the current).

When Signal Charge2 is at the H level and Signal Charge1 is at the L level, power supply circuit 10 charges first capacitor 12 in the high-speed charging mode, and first capacitor 12 is subjected to the high-speed charge (that is, is charged with a relatively large amount of a current).

A specific description is made of operations at this time. When Signal Charge2 is at the H level, transistor 7d turns on. By a fact that transistor 7d turns on, transistor 7b turns on. Meanwhile, when Signal Charge1 is at the L level, transistor 7c turns off. By a fact that transistor 7c turns off, transistor 7a turns off. By a fact that transistor 7b turns on and transistor 7a turns off, first capacitor 12 is charged with an amount of a current, which corresponds to Voltage Vin of the input power input to first charging circuit 13 and corresponds to resistor 3b. That is to say, first capacitor 12 is charged with an amount of a current, which corresponds to a magnitude of a resistance value of resistor 3b. In first charging circuit 13, resistor 3b is set to a resistance value smaller than that of resistor 3a. In such a way, the amount of the current flowing through first capacitor 12 can be made relatively large. Hence, when Signal Charge2 is at the H level and Signal Charge1 is at the L level, first charging circuit 13 turns to a charging mode in which the charging speed is relatively fast (that is, the high-speed charging mode), and first capacitor 12 is charged at a relatively fast charging speed (that is, a relatively large amount of the current).

Signal Sense is a signal that indicates the charging voltage of first capacitor 12. Control circuit 15 detects the charging voltage of first capacitor 12 by measuring a voltage of Signal Sense. Note that resistor 3l provided in first capacitor 12 is a general resistor for voltage detection.

As described above, first charging circuit 13 can charge first capacitor 12 in two types of the charging modes in which the charging speeds are different from each other. Moreover, control circuit 15 can detect the charging voltage of first capacitor 12.

However, in general, in a circuit that charges a capacitor, a relatively large current is prone to flow through the capacitor immediately after the capacitor is started to be charged, and an amount of the current is changed to a large extent, whereby noise is generated in some cases. Therefore, in first charging circuit 13, noise is generated in some cases when first capacitor 12 is charged.

[1-2. Operations]

A description is made below of operations of audio signal amplification device 1 in this exemplary embodiment, which is configured as described above.

First, a description is made of operations of power supply circuit 10 when power is supplied to audio signal amplification device 1.

Figure 4:
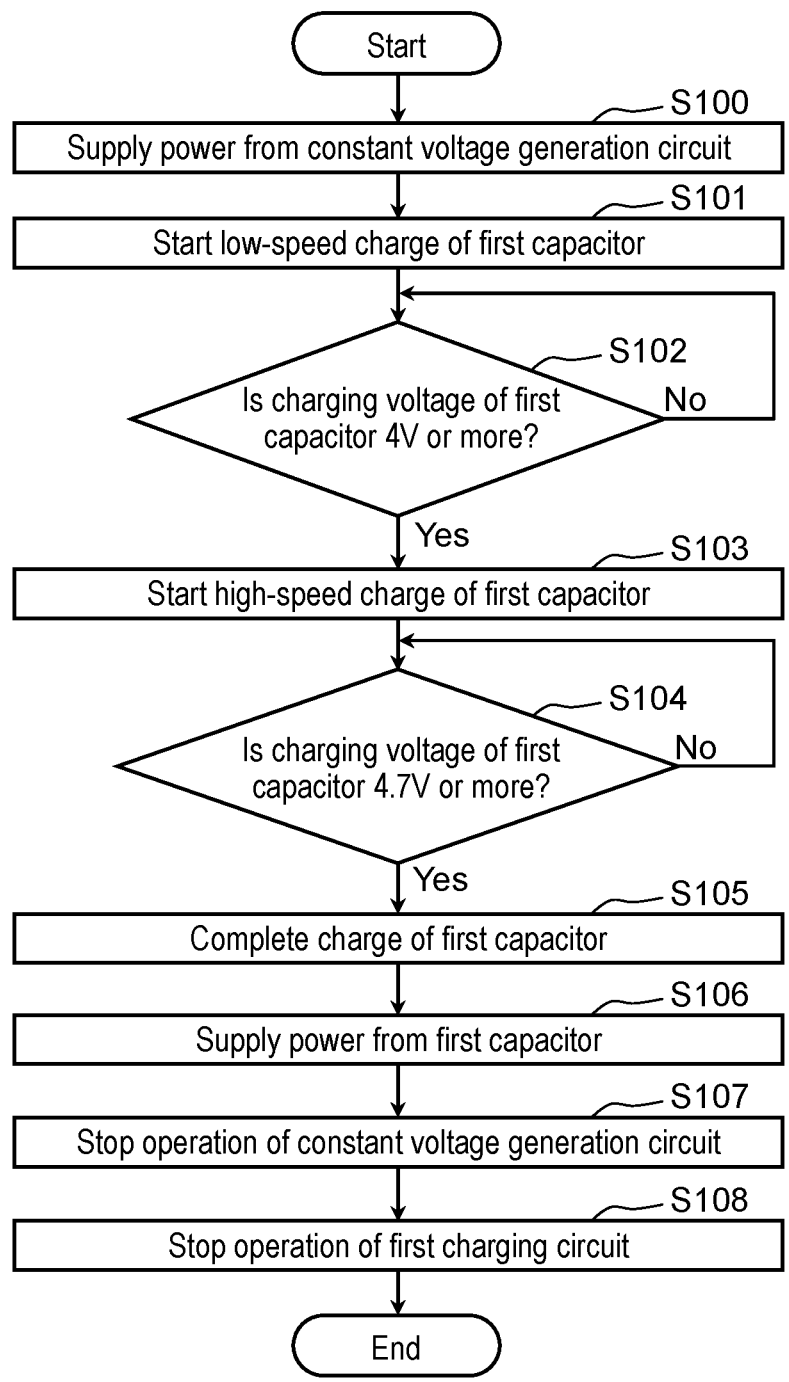
FIG. 4 is a flowchart showing an operation example of a power supply circuit when power is supplied to the audio signal amplification device in the first exemplary embodiment.

FIG. 4 is a flowchart showing an operation example of power supply circuit 10 when power is supplied to audio signal amplification device 1 in the first exemplary embodiment.

When the power is supplied to audio signal amplification device 1, control circuit 15 controls selection circuit 14 so that the direct current power, which is generated by constant voltage generation circuit 11, can be selected in selection circuit 14 and can be supplied to clock generation circuit 20 (Step S100).

That is to say, in power supply circuit 10, when the power is supplied to audio signal amplification device 1, the signal, which indicates the instruction to actuate constant voltage generation circuit 11, is transmitted from control circuit 15 to constant voltage generation circuit 11, and the direct current power is generated in constant voltage generation circuit 11. Then, the signal, which indicates the instruction to select constant voltage generation circuit 11, is transmitted from control circuit 15 to selection circuit 14, and the direct current power, which is generated in constant voltage generation circuit 11, is supplied from selection circuit 14 to clock generation circuit 20.

Note that, for example, as shown by a broken line in FIG. 2, control circuit 15 may be configured so as to monitor a voltage of the input power, and to determine that the power is supplied to audio signal amplification device 1 when the voltage of the input power reaches a predetermined voltage (for example, Voltage Vin). Alternatively, control circuit 15 may be configured so that a signal, which indicates that the power is supplied to audio signal amplification device 1, can be input to control circuit 15.

Next, control circuit 15 controls first charging circuit 13 so that first charging circuit 13 can charge first capacitor 12 in the low-speed charging mode (Step S101).

A charging voltage of first capacitor 12 before the charge is started is lower in comparison with a charging voltage of first capacitor 12 charged sufficiently. That is to say, a voltage difference between the charging voltage of first capacitor 12 and Voltage Vin immediately after the power is supplied to audio signal amplification device 1 is relatively large. Therefore, such a relatively large current is prone to flow through first capacitor 12 immediately after first capacitor 12 is started to be charged. Hence, when first capacitor 12 is charged in the high-speed charging mode when the power is supplied to audio signal amplification device 1, there is a possibility that such a relatively large current may flow through first charging circuit 13. However, the amount of the current flowing through first charging circuit 13 can be suppressed in such a manner that first capacitor 12 is charged in the low-speed charging mode.

Accordingly, immediately after the power is supplied to audio signal amplification device 1, control circuit 15 controls first charging circuit 13 so that first charging circuit 13 can charge first capacitor 12 in the low-speed charging mode.

Specifically, immediately after the power is supplied to audio signal amplification device 1, control circuit 15 turns Signal Charge1 to the H level, and turns Signal Charge2 to the L level. In such a way, to first capacitor 12, the current flows through a route passing through resistor 3a having a larger resistance value than resistor 3b, and first capacitor 12 is charged with a relatively small amount of the current (that is, is charged in the low-speed charging mode). In such a way, the load applied to first charging circuit 13 is suppressed, and deterioration of capacitors 5a to 5c which first capacitor 12 has is suppressed.

Next, control circuit 15 compares the charging voltage of first capacitor 12 and a predetermined first threshold value with each other, and determines whether or not the charging voltage of first capacitor 12 is the first threshold value or more (Step S102).

In Step S102, control circuit 15 detects the charging voltage of first capacitor 12 by measuring the voltage of Signal Sense (refer to FIG. 3). Note that the first threshold value used by control circuit 15 in Step S102 is assumed to be set, for example, to 4 (V); however, this exemplary embodiment never limits the first threshold value to this numeric value, and the first threshold value may be set to other numeric values.

In a case where it is determined in Step S102 that the charging voltage of first capacitor 12 is less than the first threshold value (for example, 4 (V)) (No in Step S102), control circuit 15 controls first charging circuit 13 so that the charge from first charging circuit 13 to first capacitor 12 can be maintained in the low-speed charging mode. That is to say, control circuit 15 maintains Signal Charge1 at the H level, and maintains Signal Charge2 at the L level. Then, control circuit 15 repeatedly makes the determination of Step S102 until the charging voltage of first capacitor 12 becomes the first threshold value (for example, 4 (V)) or more.

In a case where it is determined in Step S102 that the charging voltage of first capacitor 12 is the first threshold value (for example, 4 (V)) or more (Yes in Step S102), control circuit 15 controls first charging circuit 13 so that first charging circuit 13 can charge first capacitor 12 in the high-speed charging mode (Step S103).

Specifically, control circuit 15 changes Signal Charge1 from the H level to the L level, and changes Signal Charge2 from the L level to the H level. In such a way, to first capacitor 12, the current flows through a route passing through resistor 3b having a smaller resistance value than resistor 3a, and first capacitor 12 is charged with a relatively large amount of the current (that is, is charged in the high-speed charging mode).

Next, control circuit 15 compares the charging voltage of first capacitor 12 and a predetermined second threshold value with each other, and determines whether or not the charging voltage of first capacitor 12 is the second threshold value or more (Step S104).

In Step S104, in a similar way to Step S102, control circuit 15 detects the charging voltage of first capacitor 12 by measuring the voltage of Signal Sense (refer to FIG. 3). Note that the second threshold value used by control circuit 15 in Step S104 is assumed to be set, for example, to 4.7 (V); however, this exemplary embodiment never limits the second threshold value to this numeric value, and the second threshold value may be set to other numeric values. Note that the second threshold value is assumed to be set to a numeric value larger than the first threshold value.

In a case where it is determined in Step S104 that the charging voltage of first capacitor 12 is less than the second threshold value (for example, 4.7 (V)) (No in Step S104), control circuit 15 controls first charging circuit 13 so that the charge from first charging circuit 13 to first capacitor 12 can be maintained in the high-speed charging mode. That is to say, control circuit 15 maintains Signal Charge1 at the L level, and maintains Signal Charge2 at the H level. Then, control circuit 15 repeatedly makes the determination of Step S104 until the charging voltage of first capacitor 12 becomes the second threshold value (for example, 4.7 (V)) or more.

In a case where it is determined in Step S104 that the charging voltage of first capacitor 12 is the second threshold value (for example, 4.7 (V)) or more (Yes in Step S104), the charge to first capacitor 12 is completed in power supply circuit 10 (Step S105).

As described above, in power supply circuit 10, when the charging voltage of first capacitor 12 reaches the second threshold value (for example, 4.7 (V)), the charge to first capacitor 12 is completed. Note that power supply circuit 10 executes Step S108 to be described later, and thereby stops the charge to first capacitor 12.

When the power is supplied to audio signal amplification device 1, and the charge to first capacitor 12 is completed, then control circuit 15 controls selection circuit 14 so that the direct current power, which is charged to first capacitor 12, can be selected in selection circuit 14 and can be supplied to clock generation circuit 20 (Step S106).

That is to say, in power supply circuit 10, when the charge to first capacitor 12 is completed, the signal, which indicates the instruction to select first capacitor 12, is transmitted from control circuit 15 to selection circuit 14. In such a way, the power supplied to clock generation circuit 20 is switched from the direct current power, which is generated in constant voltage generation circuit 11, to the direct current power, which is charged to first capacitor 12. That is to say, the direct current power charged to first capacitor 12 is supplied from selection circuit 14 to clock generation circuit 20. In such a way, clock generation circuit 20 is supplied with the direct current power from first capacitor 12.

After Step S106, control circuit 15 controls constant voltage generation circuit 11 to stop the operation of constant voltage generation circuit 11 (Step S107).

Specifically, the signal, which indicates the instruction to stop constant voltage generation circuit 11, is transmitted from control circuit 15 to constant voltage generation circuit 11, whereby constant voltage generation circuit 11 stops operating.

Note that constant voltage generation circuit 11 operates next after the operations of audio signal amplification device 1 under operation are stopped, and the power is supplied to audio signal amplification device 1 one more time. That is to say, in power supply circuit 10, when the power supplied to clock generation circuit 20 is switched from the direct current power generated in constant voltage generation circuit 11 to the direct current power charged to first capacitor 12, and the operations of constant voltage generation circuit 11 are stopped, then the power supplied to clock generation circuit 20 becomes the direct current power, which is charged to first capacitor 12, until the operations of audio signal amplification device 1 are stopped.

After the determination of Yes is made in Step S104, control circuit 15 controls first charging circuit 13 so that the charge from first charging circuit 13 to first capacitor 12 can be stopped (Step S108).

Specifically, control circuit 15 changes Charge2 from the H level to the L level while maintaining Signal Charge1 at the L level. In such a way, both of transistors 7a and 7b turn off, the current from first charging circuit 13 to first capacitor 12 is stopped, and the charge to first capacitor 12 is stopped.

As described above, in power supply circuit 10, when the power is supplied to audio signal amplification device 1, then first, the supply of the direct current power is started from constant voltage generation circuit 11 to clock generation circuit 20, and at substantially a same time as the start, the charge to first capacitor 12 is started. When the charge to first capacitor 12 is completed (that is, when the charging voltage of first capacitor 12 reaches the second threshold value), then the power supplied to clock generation circuit 20 is changed from the direct current power generated in constant voltage generation circuit 11 to the direct current power charged to first capacitor 12. In such a way, clock generation circuit 20 is supplied with the direct current power from first capacitor 12.

Next, a description is made of operations of power supply circuit 10 after the charge to first capacitor 12 is completed.

Figure 5:
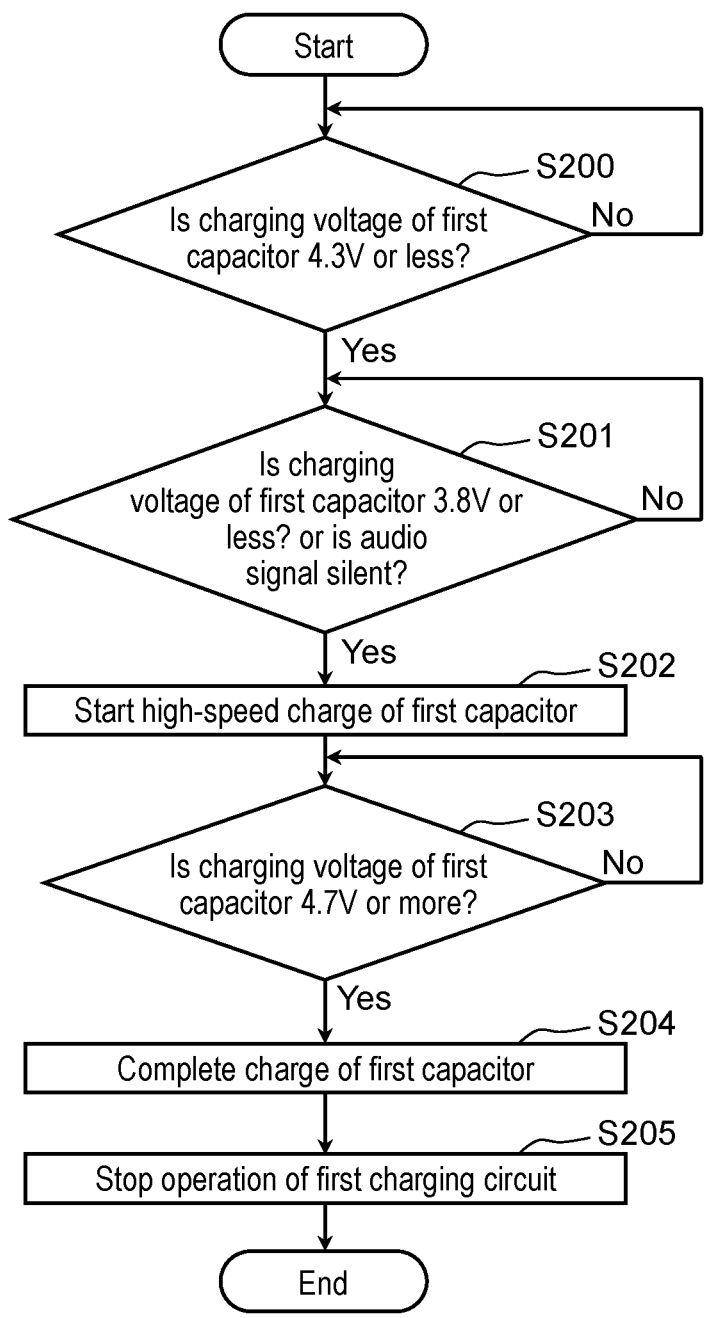
FIG. 5 is a flowchart showing an operation example of the power supply circuit after completion of a charge of the first capacitor in the first exemplary embodiment is completed.

FIG. 5 is a flowchart showing an operation example of power supply circuit 10 after the charge of first capacitor 12 in the first exemplary embodiment is completed.

After Step S108, control circuit 15 compares the charging voltage of first capacitor 12 and a predetermined third threshold value with each other, and determines whether or not the charging voltage of first capacitor 12 is the third threshold value or less (Step S200).

In Step S200, in a similar way to Steps S102 and S104, control circuit 15 detects the charging voltage of first capacitor 12 by measuring the voltage of Signal Sense (refer to FIG. 3). Note that the third threshold value used by control circuit 15 in Step S200 is assumed to be set, for example, to 4.3 (V); however, this exemplary embodiment never limits the third threshold value to this numeric value, and the third threshold value may be set to other numeric values. Note that the third threshold value is assumed to be set to a numeric value larger than the first threshold value and smaller than the second threshold value.

In a case where it is determined in step S200 that the charging voltage of first capacitor 12 is higher than the third threshold value (for example, 4.3 (V)) (No in Step S200), control circuit 15 repeatedly makes the determination of Step S200 until the charging voltage of first capacitor 12 becomes the third threshold value or less.

In a case where it is determined in Step S200 that the charging voltage of first capacitor 12 is the third threshold value (for example, 4.3 (V)) or less (Yes in Step S200), control circuit 15 advances the processing to Step S201.

Control circuit 15 compares the charging voltage of first capacitor 12 and a predetermined fourth threshold value with each other, and determines whether or not the charging voltage of first capacitor 12 is the fourth threshold value or less. In addition, control circuit 15 determines whether or not the audio signal input to audio signal amplification device 1 has become a signal indicating silence (Step S201).

Note that the fourth threshold value used by control circuit 15 in Step S201 is assumed to be set, for example, to 3.8 (V); however, this exemplary embodiment never limits the fourth threshold value to this numeric value, and the fourth threshold value may be set to other numeric values. Note that the fourth threshold value is assumed to be set to a numeric value smaller than the first threshold value.

Note that the second threshold value and the fourth threshold value may be set in response to specifications of clock generation circuit 20. For example, in the specifications of clock generation circuit 20, if a voltage of the power supplied to clock generation circuit 20 is set to 3.8 (V) to 4.7 (V), then the second threshold value may be set to 4.7 (V), and the fourth threshold value may be set to 3.8 (V). In such a way, the charging voltage of first capacitor 12 is maintained within a range of 3.8 (V) to 4.7 (V), and accordingly, clock generation circuit 20 can be operated stably. Moreover, it is desirable that the first threshold value and the third threshold value be set appropriately based on the second threshold value, the third threshold value, the specifications of power supply circuit 10, and the like.

Note that, in order to determine whether or not the audio signal has become the signal indicating silence, control circuit 15 may include a circuit (not shown) that detects the audio signal. Alternatively, an audio signal detection circuit (not shown) for detecting the audio signal may be provided outside of control circuit 15, and control circuit 15 may be configured to determine whether or not the audio signal has become the signal, which indicates silence, by receiving a signal indicating a detection result output from the audio signal detection circuit.

In a case where it is determined in Step S201 that the charging voltage of first capacitor 12 is higher than the fourth threshold value (for example, 3.8 (V)), and that the audio signal has not become the signal indicating silence (No in Step S201), control circuit 15 repeats the determination of Step S201 until the charging voltage of first capacitor 12 becomes the fourth threshold value or less or the audio signal becomes the signal indicating silence.

In a case where it is determined in Step S201 that the charging voltage of first capacitor 12 is the fourth threshold value (for example, 3.8 (V)) or less, or in a case where it is determined in Step S201 that the audio signal has become the signal indicating silence (Yes in Step S201), control circuit 15 controls first charging circuit 13 so that first charging circuit 13 can charge first capacitor 12 in the high-speed charging mode (Step S202).

That is to say, processing of Step S202 is executed in a case where, in Step S201, a determination of Yes is made in at least one of the determination as to whether or not the charging voltage of first capacitor 12 is the fourth threshold value (for example, 3.8 (V)) or less and the determination as to whether or not the audio signal has become the signal indicating silence. Note that processing of Step S202 is substantially same as the processing of Step S103 shown in FIG. 4, and accordingly, a repeated description is omitted.

Power supply circuit 10 executes the processing of Steps S200 to S202, and thereby operates as follows.

In a case where it is determined that the charging voltage of first capacitor 12 does not decrease very much from the voltage (for example, 4.7 (V)) at the time when the charge is completed, that is, when the charging voltage of first capacitor 12 is within a range from the second threshold value to the third threshold value (for example, higher than 4.3 (V) and 4.7 (V) or less), control circuit 15 operates so as to suppress "a matter that first charging circuit 13 operates to generate noise in first charging circuit 13". That is to say, when the charging voltage of first capacitor 12 is within the range from the second threshold value to the third threshold value, control circuit 15 controls first charging circuit 13 not to perform the charge to first capacitor 12.

When the charging voltage of first capacitor 12 further decreases from the voltage (for example, 4.7 (V)) at the time when the charge is completed, and stays within a range from the third threshold value to the fourth threshold value (for example, higher than 3.8 (V) and 4.3 (V) or less), control circuit 15 determines whether or not the audio signal has become the signal indicating silence.

That is to say, when the charging voltage of first capacitor 12 decreases to become the third threshold value (for example, 4.3 (V)) or less, control circuit 15 determines whether or not the audio signal has become the signal, which indicates silence, if the charging voltage of first capacitor 12 is within the range from the third threshold value to the fourth threshold value (for example, higher than 3.8 (V) and 4.3 (V) or less). Then, if the audio signal has not become the signal indicating silence, then control circuit 15 does not instruct first charging circuit 13 to charge first capacitor 12. If the audio signal has become the signal indicating silence, then control circuit 15 executes Step S202, and controls first charging circuit 13 so that first charging circuit 13 can charge first capacitor 12 in the high-speed charging mode.

Then, if the charging voltage of first capacitor 12 further decreases to become the fourth threshold value (for example, 3.8 (V)) or less, then no matter whether or not the audio signal may have become the signal indicating silence, control circuit 15 executes Step S202, and controls first charging circuit 13 to charge first capacitor 12 in the high-speed charging mode.

After Step S202 is executed, control circuit 15 compares the charging voltage of first capacitor 12 and the predetermined second threshold value (for example, 4.7 (V)) with each other, and determines whether or not the charging voltage of first capacitor 12 is the second threshold value or more (Step S203).

In a case where it is determined in Step S203 that the charging voltage of first capacitor 12 is less than the second threshold value (for example, 4.7 (V)) (No in Step S203), control circuit 15 controls first charging circuit 13 so that the charge from first charging circuit 13 to first capacitor 12 can be maintained in the high-speed charging mode. That is to say, control circuit 15 maintains Signal Charge1 at the L level, and maintains Signal Charge2 at the H level. Then, control circuit 15 repeatedly makes the determination of Step S203 until the charging voltage of first capacitor 12 becomes the second threshold value (for example, 4.7 (V)) or more.

In a case where it is determined in Step S203 that the charging voltage of first capacitor 12 is the second threshold value (for example, 4.7 (V)) or more (Yes in Step S203), the charge to first capacitor 12 is completed in power supply circuit 10 (Step S204).

Then, control circuit 15 controls first charging circuit 13 so that the charge from first charging circuit 13 to first capacitor 12 can be stopped (Step S205). Processing of Step S205 is substantially same as the processing of Step S108 shown in FIG. 4, and accordingly, a repeated description is omitted.

After Step S205, the processing returns to Step S200, and a series of the processing of Step S200 and after are repeatedly executed until the operations of audio signal amplification device 1 are stopped.

As described above, in a case where the charging voltage of first capacitor 12 decreases to become the fourth threshold value or less after control circuit 15 controls selection circuit 14 so that selection circuit 14 can select the direct current power, which is charged to first capacitor 12, and can supply the selected directed current power to clock generation circuit 20 (that is, after Step S106 is executed), control circuit 15 executes Step S202, and controls first charging circuit 13 so that first charging circuit 13 can charge first capacitor 12 in the high-speed charging mode. At this time, clock generation circuit 20 is not supplied with the direct current power generated by constant voltage generation circuit 11.

That is to say, in this exemplary embodiment, in the case where the charging voltage of first capacitor 12 decreases to become the third threshold value (for example, 4.3 (V)) or less, and the audio signal has become the signal indicating silence, or in the case where the charging voltage of first capacitor 12 further decreases to become the fourth threshold value (for example, 3.8 (V)) or less, then control circuit 15 executes Steps S202 to S204 while supplying clock generation circuit 20 with the direct current power charged to first capacitor 12, and controls first charging circuit 13 so that first capacitor 12 can be charged in the high-speed charging mode.

[1-3. Effects and the Like]

As described above, in this exemplary embodiment, the audio signal amplification device is an audio signal amplification device that amplifies an audio signal, including: a clock generation circuit that generates a clock for use in amplifying the audio signal; and a power supply circuit that generates direct current power, which is supplied to the clock generation circuit, from input power. The power supply circuit includes: a constant voltage generation circuit that generates direct current power of a constant voltage from the input power; a first capacitor; a first charging circuit that charges the first capacitor by using the input power; and a selection circuit. The selection circuit selects one direct current power of the direct current power generated in the constant voltage generation circuit and of direct current power charged to the first capacitor, and supplies the selected direct current power to the clock generation circuit.

Moreover, in this exemplary embodiment, a power supply device includes: a constant voltage generation circuit that generates direct current power of a constant voltage from input power; a first capacitor; a first charging circuit that charges the first capacitor by using the input power; and a selection circuit. The selection circuit selects one direct current power of the direct current power generated in the constant voltage generation circuit and of direct current power charged to the first capacitor, and outputs the selected direct current power.

Note that audio signal amplification device 1 is an example of the audio signal amplification device. Clock generation circuit 20 is an example of the clock generation circuit. Power supply circuit 10 is an example of the power supply circuit. Constant voltage generation circuit 11 is an example of the constant voltage generation circuit. First capacitor 12 is an example of the first capacitor. First charging circuit 13 is an example of the first charging circuit. Selection circuit 14 is an example of the selection circuit. Power supply circuit 10 is an example of the power supply device.

For example, in the operation example of audio signal amplification device 1 shown in the first exemplary embodiment, when noise propagates from power supply circuit 10 to clock generation circuit 20, then there is a possibility that clock generation circuit 20 may generate a clock affected by the noise. When the clock affected by the noise is supplied to amplifier circuit 30, and the audio signal is amplified based on the clock, then there is a possibility that distortion of the output audio signal may be increased, causing a deterioration of an S/N ratio. Therefore, desirably, the propagation of the noise from power supply circuit 10 to clock generation circuit 20 is suppressed as much as possible, and stable direct current power is supplied from power supply circuit 10 to clock generation circuit 20.

Constant voltage generation circuit 11 provided in power supply circuit 10 continuously performs the operation of generating and outputting the direct current power from the input power. Therefore, constant voltage generation circuit 11 is prone to be affected by the noise. Hence, for example, if the noise is generated in the input power when the direct current power is supplied from constant voltage generation circuit 11 to clock generation circuit 20, then there is a possibility that the noise may propagate from constant voltage generation circuit 11, which is affected by the noise, to clock generation circuit 20.

Meanwhile, in first capacitor 12, the power charged to capacitors 5a to 5c which first capacitor 12 has is used as the direct current power. Hence, for example, even if the noise is generated in the input power, the direct current power supplied from first capacitor 12 is less likely to be affected by the noise.

In such a way, in power supply circuit 10, first capacitor 12 can be treated as a power source such as a battery, in which the noise is less likely to be generated.

Moreover, in power supply circuit 10, when the direct current power charged to first capacitor 12 is selected in selection circuit 14, constant voltage generation circuit 11 in which the noise is prone to be generated and clock generation circuit 20 are electrically isolated from each other. Moreover, clock generation circuit 20 is also electrically isolated from the power supply that supplies the input power. Hence, when power supply circuit 10 supplies the direct current power, which is charged to first capacitor 12, to clock generation circuit 20, the propagation of the noise from power supply circuit 10 to clock generation circuit 20 can be suppressed, and the stable direct current power can be supplied to clock generation circuit 20.

In this exemplary embodiment, the power supply circuit may further include a control circuit. When power is supplied to the audio signal amplification device, the control circuit may control the selection circuit so that the direct current power generated in the constant voltage generation circuit can be selected in the selection circuit and can be supplied to the clock generation circuit, and may control first charging circuit so that the first capacitor can be charged by the first charging circuit.

In this exemplary embodiment, when a charging voltage of the first capacitor reaches a predetermined threshold value after the power is supplied to the audio signal amplification device, the control circuit may control the selection circuit so that the direct current power charged to the first capacitor can be selected in the selection circuit and can be supplied to the clock generation circuit.

Note that control circuit 15 is an example of the control circuit. The second threshold value is an example of the predetermined threshold value.

In such a way, for example, in the operation example of audio signal amplification device 1 shown in the first exemplary embodiment, after the power is supplied to audio signal amplification device 1, clock generation circuit 20 is supplied with the direct current power, which is generated by constant voltage generation circuit 11, until the charge to first capacitor 12 by first charging circuit 13 is started and the charging voltage of first capacitor 12 reaches the second threshold value.

For example, if capacitors 5a to 5c provided in first capacitor 12 are electric double layer capacitors, then it takes a relatively long time until the charge of first capacitor 12 is completed (until the charging voltage of first capacitor 12 reaches the second threshold value). That is to say, it takes a relatively long time until it becomes possible for first capacitor 12 to supply the direct current power. However, in audio signal amplification device 1 shown in the first exemplary embodiment, the direct current power can be supplied to clock generation circuit 20 by the above-mentioned operations from immediately after the power is supplied to audio signal amplification device 1.

Moreover, after the charging voltage of first capacitor 12 reaches the second threshold value, power supply circuit 10 supplies the direct current power, which is charged to first capacitor 12, to clock generation circuit 20.

That is to say, in audio signal amplification device 1, a period while the direct current power generated in constant voltage generation circuit 11 is supplied from power supply circuit 10 to clock generation circuit 20 is only a period since the power is supplied to audio signal amplification device 1 until the charging voltage of first capacitor 12 reaches the second threshold value, and during a period other than this period, the direct current power charged to first capacitor 12 is supplied to clock generation circuit 20. Hence, at a time of supplying the power to clock generation circuit 20, power supply circuit 10 can suppress the propagation of the noise to clock generation circuit 20.

In this exemplary embodiment, at a time of controlling the selection circuit so that the direct current power charged to the first capacitor can be selected in the selection circuit and can be supplied to the clock generation circuit, the control circuit may control the constant voltage generation circuit so that an operation of the constant voltage generation circuit can be stopped.

In such a way, for example, in the operation example of audio signal amplification device 1 shown in the first exemplary embodiment, the operations of constant voltage generation circuit 11 are stopped when clock generation circuit 20 is supplied with the direct current power charged to first capacitor 12. By a fact that the operations of constant voltage generation circuit 11 are stopped, the generation of the noise in constant voltage generation circuit 11 is suppressed, and accordingly, the propagation of the noise to clock generation circuit 20 can be suppressed.

In this exemplary embodiment, at the time of controlling the selection circuit so that the direct current power charged to the first capacitor can be selected in the selection circuit and can be supplied to the clock generation circuit, the control circuit may control the first charging circuit to stop the charge to the first capacitor.

In such a way, for example, in the operation example of audio signal amplification device 1 shown in the first exemplary embodiment, the operations of first charging circuit 13 are stopped when clock generation circuit 20 is supplied with the direct current power charged to first capacitor 12. In such a way, the generation of the noise in first charging circuit 13 is suppressed, and accordingly, the propagation of the noise to clock generation circuit 20 can be suppressed.

In this exemplary embodiment, the first charging circuit may charge the first capacitor while switching two types of charging modes in which charging speeds are different from each other. After the power is supplied to the audio signal amplification device, the control circuit may control the first charging circuit so that the first capacitor can be charged in the charging mode in which the charging speed is slower.

In this exemplary embodiment, the control circuit may control the first charging circuit so that the first capacitor can be charged in the charging mode in which the charging speed is slower during a period since the power is supplied to the audio signal amplification device until the charging voltage of the first capacitor reaches a predetermined first threshold value, that the first capacitor can be charged in the charging mode in which the charging speed is faster during a period since the charging voltage of the first capacitor has become the first threshold value or more until the charging voltage of the first capacitor reaches a second threshold value numerically larger than the first threshold value, and that the charge to the first capacitor can be stopped when the charging voltage of the first capacitor has become the second threshold value or more.

In this exemplary embodiment, the control circuit may control the first charging circuit so that the first capacitor can be charged by the first charging circuit when the charging voltage of the first capacitor is equal to or less than a third threshold value numerically larger than the first threshold value and numerically smaller than the second threshold value, and when the audio signal has become a signal indicating silence.

In this exemplary embodiment, the control circuit may control the first charging circuit so that the first capacitor can be charged by the first charging circuit when the charging voltage of the first capacitor is equal to or less than a fourth threshold value numerically smaller than the first threshold value.

Note that the low-speed charging mode is an example of the charging mode in which the charging speed is slower. The high-speed charging mode is an example of the charging mode in which the charging speed is faster.

For example, in the operation example of audio signal amplification device 1 shown in the first exemplary embodiment, the charging voltage of first capacitor 12 is relatively low immediately after the charge to first capacitor 12 is started, and accordingly, there is a possibility that a relatively large current may flow from first charging circuit 13 to first capacitor 12. Then, when a large current flows from first charging circuit 13 to first capacitor 12, not only the load applied to first charging circuit 13 is increased, but also there is an apprehension that the deterioration of the capacitors which first capacitor 12 has may be accelerated. Moreover, there is a possibility that the noise may be generated in power supply circuit 10 by a fact that the amount of the current flowing through first charging circuit 13 is changed to a large extent.

However, in power supply circuit 10, first capacitor 12 is charged in the low-speed charging mode during the period since the charge to first capacitor 12 is started until the charging voltage of first capacitor 12 reaches the first threshold value, and accordingly, the amount of the current flowing from first charging circuit 13 to first capacitor 12 can be suppressed. Hence, the load applied to first charging circuit 13 can be suppressed, and the deterioration of the capacitors which first capacitor 12 has can be suppressed. Moreover, the noise generated in power supply circuit 10 can be suppressed.

Moreover, in power supply circuit 10, during the period since the charging voltage of first capacitor 12 has reached the first threshold value until the charging voltage reaches the second threshold value, first capacitor 12 is charged in the high-speed charging mode switched from the low-speed charging mode. At this time, the charging voltage of first capacitor 12 reaches the first threshold value, whereby a voltage difference between Voltage Vin of the input power and the charging voltage of first capacitor 12 becomes relatively small. Therefore, even if first capacitor 12 is charged in the high-speed charging mode during this period, the amount of the current flowing to first capacitor 12 is relatively suppressed.

Then, first capacitor 12 is charged in the high-speed charging mode (that is, in a shorter time), whereby the charge of first capacitor 12 is completed in a shorter time than a time while first capacitor 12 keeps on being charged in the low-speed charging mode. In first charging circuit 13, the noise is generated in some cases when first capacitor 12 is charged. Then, there is a possibility that the noise may propagate from power supply circuit 10 to clock generation circuit 20 when the direct current power is supplied from first capacitor 12 to clock generation circuit 20 while charging first capacitor 12. However, first capacitor 12 is charged in the high-speed charging mode, whereby a time while clock generation circuit 20 is affected by the noise can be relatively shortened.

Moreover, in power supply circuit 10, when the charging voltage of first capacitor 12 decreases to become the third threshold value or less, if the audio signal has become the signal indicating silence, then first capacitor 12 is charged in the high-speed charging mode.

As mentioned above, there is a possibility that the noise may propagate from power supply circuit 10 to clock generation circuit 20 when the direct current power is supplied from first capacitor 12 to clock generation circuit 20 while charging first capacitor 12. However, the audio signal has become the signal indicating silence, and accordingly, even if the noise propagates from power supply circuit 10 to clock generation circuit 20, such an influence of the noise is small to an extent that it can be said that there is no problem substantially.

Moreover, in power supply circuit 10, when the charging voltage of first capacitor 12 decreases to become the fourth threshold value or less, first capacitor 12 is charged in the high-speed charging mode, and accordingly, the charge of first capacitor 12 can be completed relatively early.

Moreover, in this exemplary embodiment, a power supply control method is a method for controlling a power supply device that supplies power to an instrument. The power supply device includes: a constant voltage generation circuit that generates direct current power of a constant voltage from input power; a first capacitor; a first charging circuit that charges the first capacitor by using the input power; and a selection circuit that selects one direct current power of the direct current power generated in the constant voltage generation circuit and of direct current power charged to the first capacitor, and supplies the selected direct current power to the instrument. In the power supply control method, when power is supplied to the power supply device, the selection circuit is controlled so that the direct current power generated in the constant voltage generation circuit can be selected in the selection circuit and can be supplied to the instrument, and the first charging circuit is controlled so that the first capacitor can be charged by the first charging circuit. When a charging voltage of the first capacitor reaches a predetermined threshold value after the power is supplied to the power supply device, the selection circuit is controlled so that the direct current power charged to the first capacitor can be selected in the selection circuit and can be supplied to the instrument.

Second Exemplary Embodiment

A description is made below of a second exemplary embodiment with reference to FIG. 6 to FIG. 8.

[2-1. Configuration]

A configuration and operations of audio signal amplification device 1a in the second exemplary embodiment are substantially same as those of audio signal amplification device 1 described in the first exemplary embodiment; however, audio signal amplification device 1a is different from audio signal amplification device 1 in that audio signal amplification device 1a includes power supply circuit 10a in place of power supply circuit 10. Hence, in the second exemplary embodiment, same reference numerals are assigned to substantially same constituent elements as the constituent elements described in the first exemplary embodiment, and a description of the constituent elements are omitted, and moreover, only reference numeral is assigned to audio signal amplification device 1a, and illustration regarding the configuration of audio signal amplification device 1a is also omitted. A description is made below of power supply circuit 10a different from that of the first exemplary embodiment in terms of the configuration.

Figure 6:
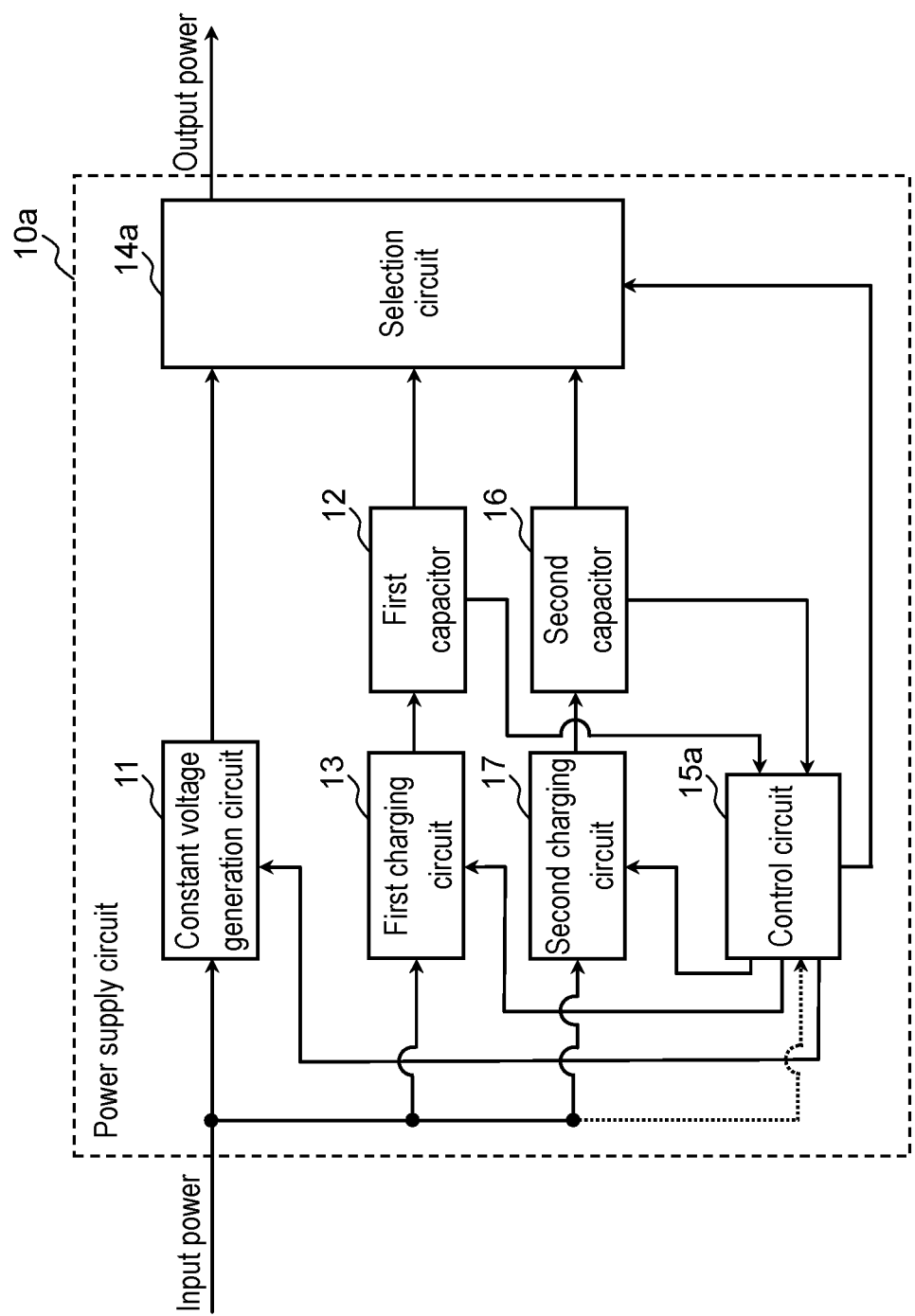
FIG. 6 is a block diagram schematically showing a configuration example of a power supply circuit in a second exemplary embodiment.

FIG. 6 is a block diagram schematically showing a configuration example of power supply circuit 10a in the second exemplary embodiment.

Power supply circuit 10a includes: constant voltage generation circuit 11; first capacitor 12; first charging circuit 13; selection circuit 14a; control circuit 15a; second capacitor 16; and second charging circuit 17. Power supply circuit 10a is different from power supply circuit 10 in the first exemplary embodiment in that power supply circuit 10a includes second capacitor 16 and second charging circuit 17. Note that configurations and operations of constant voltage generation circuit 11, first capacitor 12, and first charging circuit 13 are substantially same as those of a same block described in the first exemplary embodiment, and accordingly, a description of these is omitted.

Second capacitor 16 has a capacitor charged by second charging circuit 17. For example, capacitors which second capacitor 16 has are electric double layer capacitors. Note that, in this exemplary embodiment, in a similar way to the first exemplary embodiment, a fact that the capacitor which second capacitor 16 has is charged is written as "second capacitor 16 is charged" for a sake of convenience.

Second charging circuit 17 is a circuit that charges second capacitor 16 by using input power supplied from a power supply (not shown) such as an alternating current power supply and a direct current power supply.

Note that configurations and operations of second capacitor 16 and second charging circuit 17 are substantially same as those of first capacitor 12 and first charging circuit 13, which are shown in FIG. 3, and accordingly, a detailed description of second capacitor 16 and second charging circuit 17 is omitted.

Selection circuit 14a is a circuit that selects and outputs one direct current power from three kinds of the direct current power, which are direct current power generated in constant voltage generation circuit 11, direct current power charged to first capacitor 12, and direct current power charged to second capacitor 16. For example, the direct current power output from selection circuit 14a is supplied to clock generation circuit 20. Upon receiving a signal, which indicates an instruction to select one of constant voltage generation circuit 11, first capacitor 12 and second capacitor 16, from control circuit 15a, selection circuit 14a selects and outputs the direct current power of any of constant voltage generation circuit 11, first capacitor 12, and second capacitor 16 based on the received signal.

Note that, for example, selection circuit 14a can be realized by a publicly known 3-input 1-output circuit using a transistor switch, and accordingly, a detailed description of selection circuit 14a is omitted.

Control circuit 15a is a circuit configured so as to control constant voltage generation circuit 11, first charging circuit 13, selection circuit 14a, and second charging circuit 17. For example, control circuit 15a can be realized by: a publicly known microcomputer; a program (software for the microcomputer) created so as to cause the microcomputer to execute operations of controlling respective circuits as control targets based on a flowchart to be described later; and a publicly known storage medium (or a storage device) in which the program is stored. Hence, a detailed description regarding a configuration of control circuit 15a is omitted. Note that control circuit 15a may be realized by other circuit (for example, a semiconductor integrated circuit or the like) configured so as to perform similar operations. Moreover, in a similar way to control circuit 15 shown in the first exemplary embodiment, control circuit 15a is configured so as to be capable of detecting a charging voltage of first capacitor 12 and a charging voltage of second capacitor 16.

Moreover, control circuit 15a inputs Signal Charge1 and Signal Charge2, which are similar to Signal Charge1 and Signal Charge2, which are input from control circuit 15a to first charging circuit 13, to second charging circuit 17. Then, in a similar way to the time of controlling first charging circuit 13, control circuit 15a controls second charging circuit 17 by using Signal Charge1 and Signal Charge2.

Note that, for example, as shown by a broken line in FIG. 6, control circuit 15 may be configured so as to monitor Voltage Vin of the input power, and to determine that the power is supplied to audio signal amplification device 1a when Voltage Vin reaches a predetermined voltage. Alternatively, control circuit 15a may be configured so that a signal, which indicates that the power is supplied to audio signal amplification device 1a, can be input to control circuit 15a.

Moreover, in a similar way to control circuit 15 shown in the first exemplary embodiment, control circuit 15a may include an audio signal detection circuit (not shown) for determining whether or not the audio signal has become a signal indicating silence. Alternatively, control circuit 15a may be configured so as to determine whether or not the audio signal has become the signal, which indicates silence, by receiving a signal indicating a detection result output from an audio signal detection circuit (not shown) provided outside of control circuit 15a.

[2-2. Operations]

A description is made below of operations of audio signal amplification device 1a in the second exemplary embodiment, which is configured as described above.

First, a description is made of operations of power supply circuit 10a when power is supplied to audio signal amplification device 1a.

Figure 7:
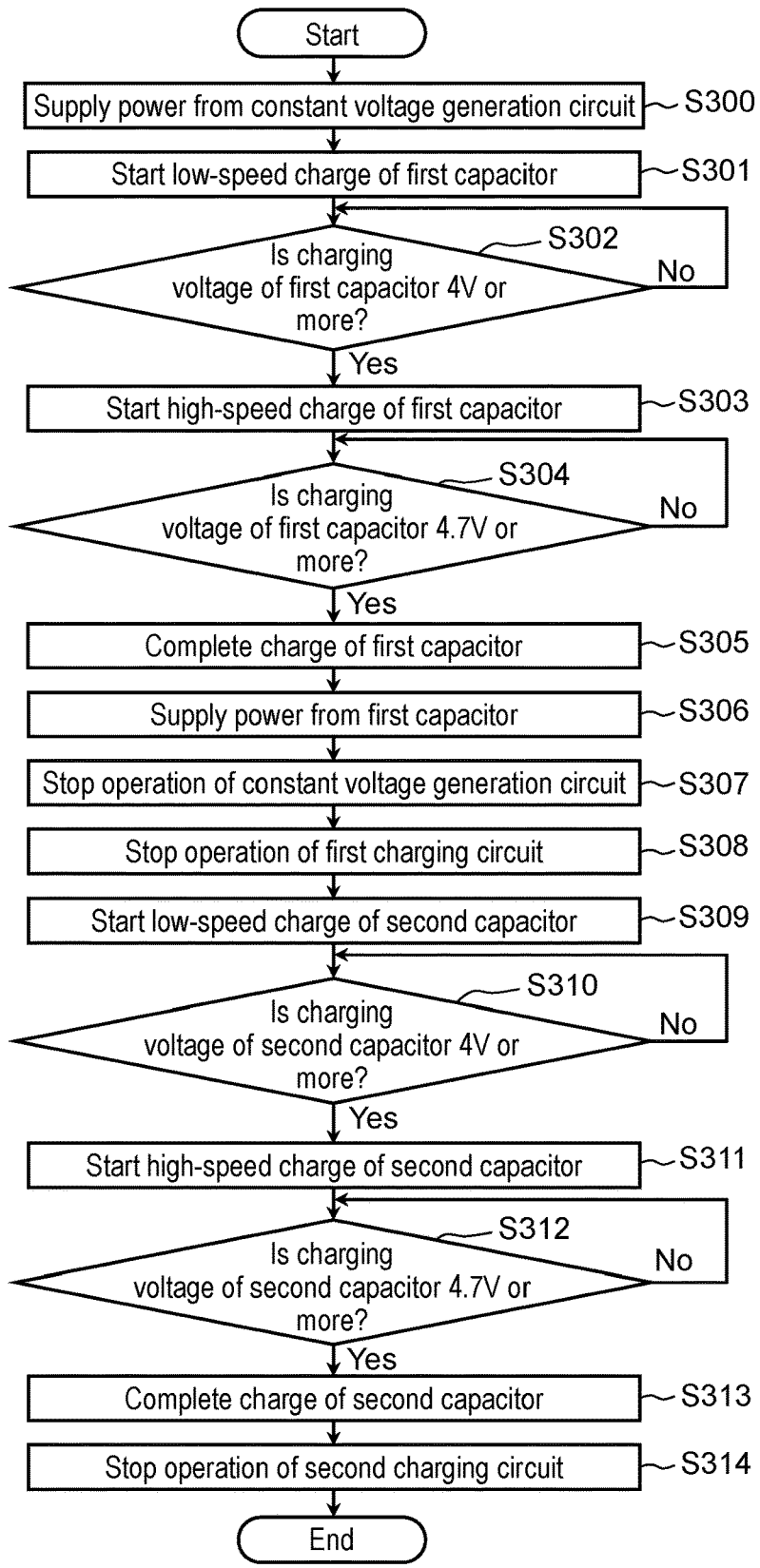
FIG. 7 is a flowchart showing an operation example of a power supply circuit when power is supplied to an audio signal amplification device in the second exemplary embodiment.

FIG. 7 is a flowchart showing an operation example of power supply circuit 10a when power is supplied to audio signal amplification device 1a in the second exemplary embodiment.

Note that respective operations of Steps S300 to S308 shown in FIG. 7 are substantially same as the respective operations of Steps S100 to S108 shown in FIG. 4 except that control circuit 15 is changed to control circuit 15a, and accordingly, a description of the operations of Steps S300 to S308 is omitted. A description is made below of operations of Step S309 and after.

In Step S308, control circuit 15a controls first charging circuit 13 so that the charge from first charging circuit 13 to first capacitor 12 can be stopped, and thereafter, control circuit 15a controls second charging circuit 17 so that second charging circuit 17 can charge second capacitor 16 in the low-speed charging mode (Step S309).

In a similar way to first charging circuit 13, second charging circuit 17 can charge second capacitor 16 in two types of charging modes in which charging speeds are different from each other (that is, the low-speed charging mode and the high-speed charging mode). Then, in Step S309, control circuit 15a controls second charging circuit 17 so that second charging circuit 17 can charge second capacitor 16 in the low-speed charging mode. In such a way, in a similar way to first charging circuit 13 in Step S301, the load applied to second charging circuit 17 is suppressed.

Next, control circuit 15a compares the charging voltage of second capacitor 16 and the predetermined first threshold value (for example, 4 (V)) with each other, and determines whether or not the charging voltage of second capacitor 16 is the first threshold value or more (Step S310).

In a case where it is determined in Step S310 that the charging voltage of second capacitor 16 is less than the first threshold value (for example, 4 (V)) (No in Step S310), control circuit 15a controls second charging circuit 17 so that the charge from second charging circuit 17 to second capacitor 16 can be maintained in the low-speed charging mode. Then, control circuit 15a repeatedly makes the determination of Step S310 until the charging voltage of second capacitor 16 becomes the first threshold value (for example, 4 (V)) or more.

In a case where it is determined in Step S310 that the charging voltage of second capacitor 16 is the first threshold value (for example, 4 (V)) or more (Yes in Step S310), control circuit 15a controls second charging circuit 17 so that second charging circuit 17 can charge second capacitor 16 in the high-speed charging mode (Step S311).

Next, control circuit 15a compares the charging voltage of second capacitor 16 and the predetermined second threshold value (for example, 4.7 (V)) with each other, and determines whether or not the charging voltage of second capacitor 16 is the second threshold value or more (Step S312).

In a case where it is determined in Step S312 that the charging voltage of second capacitor 16 is less than the second threshold value (for example, 4.7 (V)) (No in Step S312), control circuit 15a controls second charging circuit 17 so that the charge from second charging circuit 17 to second capacitor 16 can be maintained in the high-speed charging mode. Then, control circuit 15a repeatedly makes the determination of Step S312 until the charging voltage of second capacitor 16 becomes the second threshold value (for example, 4.7 (V)) or more.

In a case where it is determined in Step S312 that the charging voltage of second capacitor 16 is the second threshold value (for example, 4.7 (V)) or more (Yes in Step S312), the charge to second capacitor 16 is completed in power supply circuit 10a (Step S313).

Then, control circuit 15a controls second charging circuit 17 so that the charge from second charging circuit 17 to second capacitor 16 can be stopped (Step S314).

As described above, in power supply circuit 10a, when the power is supplied to audio signal amplification device 1a, then in a same way as the first exemplary embodiment, the supply of the direct current power is started from constant voltage generation circuit 11 to clock generation circuit 20, and at substantially a same time as the start, the charge to first capacitor 12 is started. When the charge to first capacitor 12 is completed (that is, when the charging voltage of first capacitor 12 reaches the second threshold value), then the power supplied to clock generation circuit 20 is changed from the direct current power generated in constant voltage generation circuit 11 to the direct current power charged to first capacitor 12. At this time, the operations of constant voltage generation circuit 11 and first charging circuit 13 are stopped. Moreover, when the charge to first capacitor 12 is completed, the charge to second capacitor 16 is started. When the charge to second capacitor 16 is completed (that is, when the charging voltage of second capacitor 16 reaches the second threshold value), the operations of second charging circuit 17 are stopped.

Note that respective operations of Steps S301 to S314 shown in FIG. 7 may be executed while interchanging first capacitor 12 and second capacitor 16 with each other. That is to say, the charge to second capacitor 16 may be started first. In that case, respective operations of Steps S400 to S406 shown in FIG. 8 are assumed to be executed while interchanging first capacitor 12 and second capacitor 16 with each other.

Next, a description is made of operations of power supply circuit 10a after the charge to second capacitor 16 is completed.

Figure 8:
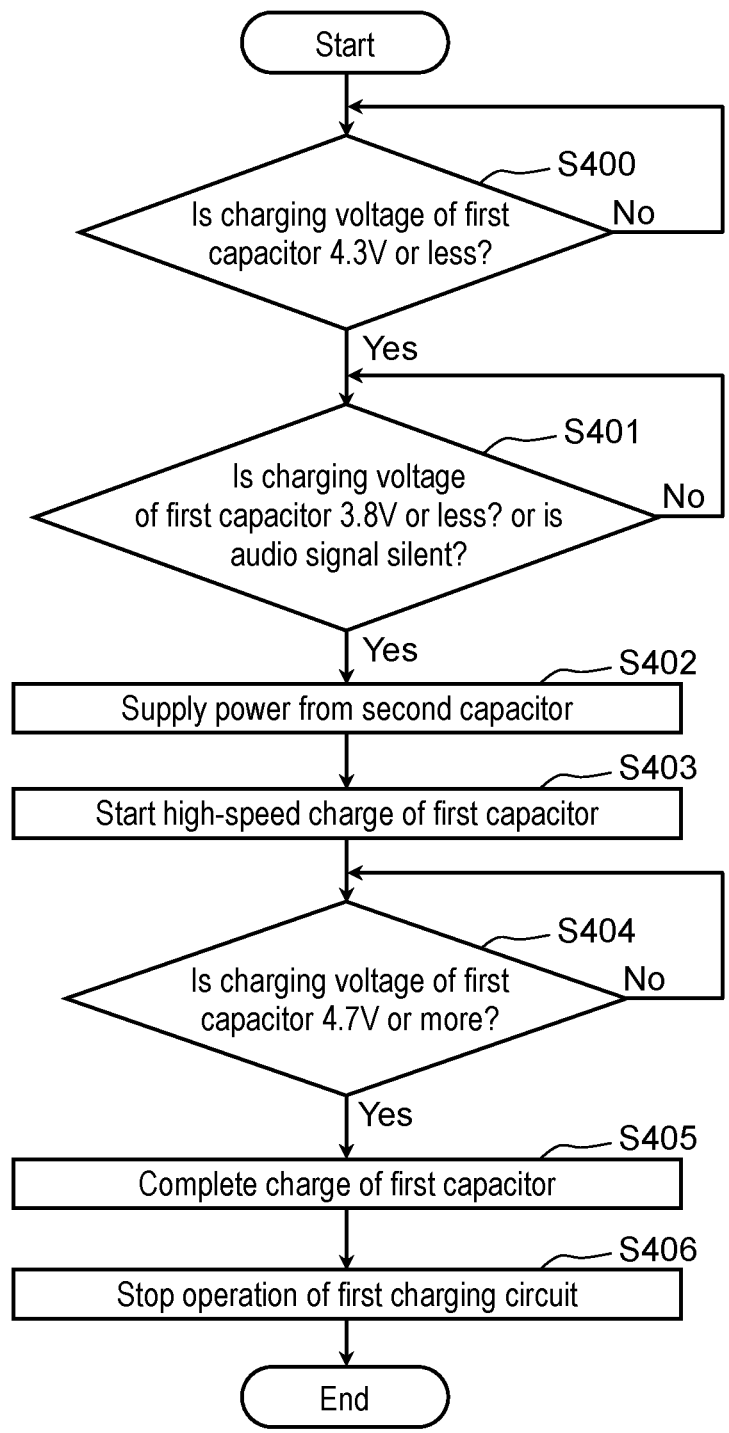
FIG. 8 is a flowchart showing an operation example of the power supply circuit after completion of a charge of a first capacitor in the second exemplary embodiment is completed.

FIG. 8 is a flowchart showing an operation example of power supply circuit 10a after the charge of first capacitor 12 in the second exemplary embodiment is completed.

Note that respective operations of Steps S400 and S401 shown in FIG. 8 are substantially same as the respective operations of Steps S200 and S201 shown in FIG. 5 except that control circuit 15 is changed to control circuit 15a, and accordingly, a description of the operations of Steps S400 and S401 is omitted. A description is made below of operations of Step S402 and after.

In a case where it is determined in Step S401 that the charging voltage of first capacitor 12 is the fourth threshold value (for example, 3.8 (V)) or less, or in a case where it is determined in Step S401 that the audio signal has become the signal indicating silence (Yes in Step S401), control circuit 15a controls selection circuit 14a so that the direct current power charged to second capacitor 16 can be selected in selection circuit 14a and can be supplied to clock generation circuit 20 (Step S402).

That is to say, in power supply circuit 10a, in such a case where the determination of Yes is made in at least either one of the determination in Step S401 as to whether or not the charging voltage of first capacitor 12 is the fourth threshold value (for example, 3.8 (V)) or less and the determination in Step S401 as to whether or not the audio signal has become the signal indicating silence, the signal indicating the instruction to select second capacitor 16 is transmitted from control circuit 15*a* to selection circuit 14*a*. In such a way, the power supplied to clock generation circuit 20 is switched from the direct current power, which is charged to first capacitor 12, to the direct current power, which is charged to second capacitor 16. That is to say, the direct current power charged to second capacitor 16 is supplied from selection circuit 14*a* to clock generation circuit 20.

Next, control circuit 15*a* controls first charging circuit 13 so that first charging circuit 13 can charge first capacitor 12 in the high-speed charging mode (Step S403). Processing of Step S403 is substantially same as the processing of Step S103 shown in FIG. 4.

Next, control circuit 15*a* compares the charging voltage of first capacitor 12 and the predetermined second threshold value (for example, 4.7 (V)) with each other, and determines whether or not the charging voltage of first capacitor 12 is the second threshold value or more (Step S404). Processing of Step S404 is substantially same as the processing of Step S104 shown in FIG. 4.

In a case where it is determined in Step S404 that the charging voltage of first capacitor 12 is less than the second threshold value (for example, 4.7 (V)) (No in Step S404), control circuit 15*a* controls first charging circuit 13 so that the charge from first charging circuit 13 to first capacitor 12 can be maintained in the high-speed charging mode.

In a case where it is determined in Step S404 that the charging voltage of first capacitor 12 is the second threshold value (for example, 4.7 (V)) or more (Yes in Step S404), the charge to first capacitor 12 is completed in power supply circuit 10*a* (Step S405).

Then, control circuit 15*a* controls first charging circuit 13 so that the charge from first charging circuit 13 to first capacitor 12 can be stopped (Step S406). Processing of Step S406 is substantially same as the processing of Step S108 shown in FIG. 4.

As described above, in a case where the charging voltage of first capacitor 12 decreases to become the third threshold value (for example, 4.3 (V)) or less and the audio signal has become the signal indicating silence or in a case where the charging voltage of first capacitor 12 further decreases to become the fourth threshold value (for example, 3.8 (V)) or less after control circuit 15*a* controls selection circuit 14*a* so that selection circuit 14*a* can select the direct current power, which is charged to first capacitor 12, (that is, after Step S306 is executed), can be supplied to clock generation circuit 20, then control circuit 15*a* executes Step S402, and controls selection circuit 14*a* so that the direct current power charged to second capacitor 16 can be selected in selection circuit 14*a* and can be supplied to clock generation circuit 20. Moreover, control circuit 15*a* executes Step S403, and controls first charging circuit 13 so that first charging circuit 13 can charge first capacitor 12 in the high-speed charging mode.

In the first exemplary embodiment, as shown in FIG. 5, when the determination of Yes is made in Step S201, and Step S202 is executed and first capacitor 12 is charged in the high-speed charging mode, then in selection circuit 14, the direct current power charged to first capacitor 12 is left selected. That is to say, in power supply circuit 10 shown in the first exemplary embodiment, control circuit 15 controls the respective blocks so that first capacitor 12 can be charged while the direct current power charged to first capacitor 12 is being supplied to clock generation circuit 20.

Meanwhile, in power supply circuit 10*a* of this exemplary embodiment, when the determination of Yes is made in Step S401, and Step S403 is executed and first capacitor 12 is charged, then control circuit 15*a* controls the respective blocks so that the direct current power charged to second capacitor 16 can be supplied to clock generation circuit 20.

After Step S406, the processing returns to Step S400, and a series of the operations of Steps S400 to S406 are executed (not shown) while interchanging first capacitor 12 and second capacitor 16 with each other.

That is to say, in Step S400 after Step S406 shown in FIG. 8, control circuit 15*a* compares the charging voltage of second capacitor 16 and the third threshold value (for example, 4.3 (V)) with each other, and determines whether or not the charging voltage of second capacitor 16 is the third threshold value or less.

In Step S401, control circuit 15*a* compares the charging voltage of second capacitor 16 and the fourth threshold value (for example, 3.8 (V)) with each other, and determines whether or not the charging voltage of second capacitor 16 is the fourth threshold value or less. In addition, control circuit 15*a* determines whether or not the audio signal input to audio signal amplification device 1*a* has become the signal indicating silence.

In Step S402, control circuit 15*a* controls selection circuit 14*a* so that the direct current power charged to first capacitor 12 can be selected in selection circuit 14*a* and can be supplied to clock generation circuit 20.

In Step S403, control circuit 15*a* controls second charging circuit 17 so that second charging circuit 17 can charge second capacitor 16 in the high-speed charging mode.

In Step S404, control circuit 15*a* compares the charging voltage of second capacitor 16 and the second threshold value (for example, 4.7 (V)) with each other, and determines whether or not the charging voltage of second capacitor 16 is the second threshold value or more.

In Step S405, the charge to second capacitor 16 is completed.

Then, in Step S406, control circuit 15*a* controls second charging circuit 17 so that the charge from second charging circuit 17 to second capacitor 16 can be stopped.

After Step S406, the processing returns to Step S400, and the series of operations of Steps S400 to S406 are executed one more time while interchanging first capacitor 12 and second capacitor 16 with each other (that is, in a state shown in FIG. 8).

As described above, the series of operations of Steps S400 to S406 in this exemplary embodiment are executed repeatedly (until the operations of audio signal amplification device 1*a* are stopped) while interchanging first capacitor 12 and second capacitor 16 alternately with each other.

Hence, power supply circuit 10*a* shown in this exemplary embodiment operates as follows. In the case where the charging voltage of first capacitor 12 decreases and so on and the charge to first capacitor 12 is executed when the direct current power charged to first capacitor 12 is supplied to clock generation circuit 20, the power supplied to clock generation circuit 20 is changed from the direct current power charged to first capacitor 12 to the direct current power charged to second capacitor 16. Even after the charging voltage of first capacitor 12 reaches the second threshold value and the charge is completed, there continues the operation that the direct current power charged to second capacitor 16 is supplied to clock generation circuit 20. In the case where the charging voltage of second capacitor 16 decreases and so on and the charge to second capacitor 16 is executed when the direct current power charged to second capacitor 16 is supplied to clock generation circuit 20, the power supplied to clock generation circuit 20 is changed from the direct current power charged to second capacitor 16 to the direct current power charged to first capacitor 12. As described above, the direct current power is supplied to clock generation circuit 20 alternately from first capacitor 12 and second capacitor 16.

Note that, desirably, large-capacity capacitors (for example, electric double layer capacitors) are used for the capacitors, which first capacitor 12 has, and for the capacitors, which second capacitor 16 has, so that, during the charge of one capacitor (for example, first capacitor 12), the charging voltage of other capacitor (for example, second capacitor 16) that supplies the direct current power to clock generation circuit 20 cannot become the third threshold value (for example, 4.3 (V)) or less.

[2-3. Effects and the Like]

As described above, in this exemplary embodiment, the power supply circuit further includes, in the power supply circuit shown in the first exemplary embodiment: a second capacitor; and a second charging circuit that charges the second capacitor by using the input power. The selection circuit selects one direct current power among the direct current power generated in the constant voltage generation circuit, the direct current power charged to the first capacitor, and direct current power charged to the second capacitor, and supplies the selected direct current power to the clock generation circuit. When the power is supplied to the audio signal amplification device, the control circuit controls the second charging circuit so that the second capacitor can be charged by the second charging circuit. Moreover, the control circuit controls the selection circuit so that the direct current power charged to one capacitor of the first capacitor and the second capacitor, in which a charging voltage reaches a predetermined threshold value, can be selected in the selection circuit, and can be supplied to the clock generation circuit.

Note that audio signal amplification device 1a is an example of the audio signal amplification device. Power supply circuit 10a is an example of the power supply circuit. Second capacitor 16 is an example of the second capacitor. Second charging circuit 17 is an example of the second charging circuit. Selection circuit 14a is an example of the selection circuit. Control circuit 15a is an example of the control circuit. The second threshold value is an example of the predetermined threshold value.

In such a way, for example, in the operation example of audio signal amplification device 1a shown in the second exemplary embodiment, similar effects to those of audio signal amplification device 1 shown in the first exemplary embodiment can be obtained.

That is to say, in a similar way to first capacitor 12, second capacitor 16 can be treated as a power source such as a battery, in which the noise is less likely to be generated. Moreover, in power supply circuit 10a, when the direct current power charged to first capacitor 12 or the direct current power charged to second capacitor 16 is selected in selection circuit 14a, constant voltage generation circuit 11 in which the noise is prone to be generated and clock generation circuit 20 are electrically isolated from each other. Hence, when power supply circuit 10a supplies the direct current power, which is charged to first capacitor 12, or the direct current power, which is charged to second capacitor 16, to clock generation circuit 20, the propagation of the noise from power supply circuit 10a to clock generation circuit 20 can be suppressed, and the stable direct current power can be supplied to clock generation circuit 20.

Moreover, after the power is supplied to audio signal amplification device 1a, the charge to first capacitor 12 by first charging circuit 13 is started, and the charge to second capacitor 16 by second charging circuit 17 is started. Then, until the charging voltage of first capacitor 12 or the charging voltage of second capacitor 16 reaches the second threshold value, the direct current power generated by constant voltage generation circuit 11 is supplied to clock generation circuit 20. Therefore, in a similar way to audio signal amplification device 1 shown in the first exemplary embodiment, even if the capacitors which first capacitor 12 and second capacitor 16 have are, for example, electric double layer capacitors and it takes a relatively long time until the charge of the capacitors are completed (until the charging voltage reaches the second threshold value), audio signal amplification device 1a shown in the second exemplary embodiment can supply the direct current power to clock generation circuit 20 from immediately after the power is supplied to audio signal amplification device 1a.

Moreover, after the charging voltage of first capacitor 12 or the charging voltage of second capacitor 16 reaches the second threshold value, power supply circuit 10a supplies the direct current power, which is charged to the capacitor, in which the charging voltage reaches the second threshold value, to clock generation circuit 20.

As described above, in a similar way to audio signal amplification device 1 shown in the first exemplary embodiment, also in audio signal amplification device 1a shown in the second exemplary embodiment, a period while the direct current power generated in constant voltage generation circuit 11 is supplied from power supply circuit 10a to clock generation circuit 20 is only a period since the power is supplied to audio signal amplification device 1a until the charging voltage of first capacitor 12 or second capacitor 16 reaches the second threshold value, and during a period other than this period, the direct current power charged to first capacitor 12 or second capacitor 16 is supplied to clock generation circuit 20. Hence, at a time of supplying the power to clock generation circuit 20, power supply circuit 10a can suppress the propagation of the noise to clock generation circuit 20.

In this exemplary embodiment, in a case where a charging voltage of one capacitor of the first capacitor and the second capacitor, the one capacitor being selected in the selection circuit, has become a third threshold value or less and where the audio signal has become a signal indicating silence, or in a case where the charging voltage of the one capacitor has become a fourth threshold value or less, the control circuit controls the selection circuit so that the direct current power charged to other capacitor of the first capacitor and the second capacitor can be selected in the selection circuit and can be supplied to the clock generation circuit. Moreover, the control circuit controls the first charging circuit or the second charging circuit so that the one capacitor can be charged by a charging circuit of the first charging circuit and the second charging circuit, the charging circuit is a charging circuit for charging the one capacitor.

In such a way, for example, in the operation example of audio signal amplification device 1a shown in the second exemplary embodiment, in a case where the charging voltage of one capacitor between first capacitor 12 and second capacitor 16, the one capacitor supplying the direct current power to clock generation circuit 20, has become the third threshold value or less and the audio signal has become the signal indicating silence, or in a case where the charging voltage of the one capacitor has become the fourth threshold value or less, then the capacitor that supplies the power to clock generation circuit 20 is switched to the other capacitor between first capacitor 12 and second capacitor 16. Then, after the capacitor that supplies the direct current power to clock generation circuit 20 is switched from the one capacitor to the other capacitor, the one capacitor is charged. Hence, in power supply circuit 10a, the capacitor to be charged and the capacitor that supplies the direct current power to clock generation circuit 20 are different from each other, and accordingly, when the power is supplied from power supply circuit 10a to clock generation circuit 20, the propagation of the noise to clock generation circuit 20 can be further suppressed.

Other Exemplary Embodiment

As described above, the description is made of the first and second exemplary embodiments as illustration of the technology disclosed in the present application. However, the technology in the present disclosure is not limited to this, and is applicable also to exemplary embodiments, which are appropriately subjected to alteration, replacement, addition, omission, and the like. Moreover, it is also possible to form new exemplary embodiments by combining the respective constituent elements described in the foregoing first and second exemplary embodiments with one another.

Accordingly, other exemplary embodiment is illustrated below.

In the first and second exemplary embodiments, the description is made of the operation examples where the operations of constant voltage generation circuit 11 are stopped when clock generation circuit 20 is supplied with the power from the direct current power charged to first capacitor 12 or second capacitor 16. However, the present disclosure is never limited to this configuration. When clock generation circuit 20 is supplied with the power from the direct current power charged to first capacitor 12 or second capacitor 16, selection circuit 14 or selection circuit 14a is not selecting constant voltage generation circuit 11. Therefore, clock generation circuit 20 and constant voltage generation circuit 11 are electrically isolated from each other. Hence, when clock generation circuit 20 is supplied with the direct current power charged to first capacitor 12 or second capacitor 16, constant voltage generation circuit 11 may continue the operations. However, the generation of the noise is suppressed by the fact that the operations of constant voltage generation circuit 11 are stopped. Moreover, power consumption in power supply circuit 10 or power supply circuit 10a is also suppressed. Hence, when the supply of the power from constant voltage generation circuit 11 to clock generation circuit 20 is unnecessary, desirably, constant voltage generation circuit 11 stops operating.

In the second exemplary embodiment, the description is made of the operation example where, when clock generation circuit 20 is supplied with the direct current power from the one capacitor between first capacitor 12 and second capacitor 16, the other capacitor between first capacitor 12 and second capacitor 16 is charged, and when the charge is completed, the operations of the charging circuit (first charging circuit 13 or second charging circuit 17) that charges the other capacitor are stopped. However, the present disclosure is never limited to this configuration. When clock generation circuit 20 is supplied with the direct current power from the one capacitor, selection circuit 14a is not selecting the other capacitor. Therefore, clock generation circuit 20 and the charging circuit that charges the other capacitor are electrically isolated from each other. Hence, when clock generation circuit 20 is supplied with the direct current power from the one capacitor, the charging circuit that charges the other capacitor may continue to operate even if the charge of the other capacitor is completed. However, the generation of the noise is suppressed by the fact that the operations of the charging circuit that charges the other capacitor are stopped. Moreover, power consumption in power supply circuit 10a is also suppressed. Hence, after the charge of the other capacitor is completed, desirably, the charging circuit that charges the other capacitor stops operating.

In the second exemplary embodiment, the description is made of the operation example where, after the power is supplied to audio signal amplification device 1a, the first capacitor is first charged, and after the charging voltage of first capacitor 12 reaches the second threshold value, the direct current power charged to first capacitor 12 is supplied to clock generation circuit 20. However, the present disclosure is never limited to this configuration. For example, after the power is supplied to audio signal amplification device 1a, second capacitor 16 may be first charged. Alternately, first capacitor 12 and second capacitor 16 may be charged simultaneously. In this configuration, control circuit 15a may control selection circuit 14 so that the direct current power charged to the capacitor in which the charging voltage has first reached the second threshold value can be supplied to clock generation circuit 20.

The numeric values, which are shown as the first threshold value to the fourth threshold value in the first and second exemplary embodiments, are merely examples. The respective numeric values which are the first threshold value to the fourth threshold value may be set appropriately in accordance with specifications and the like of clock generation circuit 20 and the respective components. However, desirably, the respective numeric values which are the first threshold value to the fourth threshold value are set so as to satisfy a condition of fourth threshold value<first threshold value<third threshold value<second threshold value.

Orders of the respective operations described by using the flowcharts in the first and second exemplary embodiments are never limited to the orders shown in the respective flowcharts. The orders of the respective operations may be interchanged with one another within a range where no contradiction occurs in the operations in power supply circuit 10 or power supply circuit 10a.

As above, the exemplary embodiments have been described as the illustration of the technology in the present disclosure. For this purpose, the accompanying drawings and the detailed description are provided.

Hence, the constituent elements described in the accompanying drawings and the detailed description can include not only constituent elements, which are essential for solving the problem, but also constituent elements, which are provided for illustrating the above-described technology, and are not essential for solving the problem. Therefore, it should not be immediately recognized that such inessential constituent elements are essential by the fact that the inessential constituent elements are described in the detailed description and the accompanying drawings.

Moreover, the above-mentioned exemplary embodiments illustrate the technology in the present disclosure, and accordingly, can be subjected to various types of alterations, substitutions, additions, omissions and the like within the scope of claims or equivalents of the claims.

INDUSTRIAL APPLICABILITY

The present disclosure is applicable to an audio signal amplification device. Specifically, the present disclosure is applicable to a digital audio amplifier such as a D-class amplifier.

REFERENCE MARKS IN THE DRAWINGS 1, 1a: audio signal amplification device
10, 10a: power supply circuit
11: constant voltage generation circuit
12: first capacitor
13: first charging circuit
14, 14a: selection circuit
15, 15a: control circuit
16: second capacitor
17: second charging circuit
20: clock generation circuit
30: amplifier circuit
31: DSP
32: PWM processor
33: amplifier
34: LPF
3a, 3b, 3c, 3d, 3e, 3f, 3g, 3h, 3i, 3j, 3k, 3l: resistor
5a, 5b, 5c: capacitor
7a, 7b, 7c, 7d: transistor
9a: diode

The invention claimed is:

1. An audio signal amplification device that amplifies an audio signal, comprising:
 a clock generation circuit that generates a clock for use in amplifying the audio signal; and
 a power supply circuit that generates direct current power, which is supplied to the clock generation circuit, from input power,
 wherein the power supply circuit includes:
  a constant voltage generation circuit that generates direct current power of a constant voltage from the input power;
  a first capacitor;
  a first charging circuit that charges the first capacitor by using the input power; and
  a selection circuit that selects one direct current power of the direct current power generated in the constant voltage generation circuit and of direct current power charged to the first capacitor and supplies the selected direct current power to the clock generation circuit.

2. The audio signal amplification device according to claim 1, wherein the power supply circuit further includes a control circuit that, when power is supplied to the audio signal amplification device, controls the selection circuit so that the direct current power generated in the constant voltage generation circuit is selected in the selection circuit and is supplied to the clock generation circuit, and controls the first charging circuit so that the first capacitor is charged by the first charging circuit.

3. The audio signal amplification device according to claim 2, wherein, when a charging voltage of the first capacitor reaches a predetermined threshold value after the power is supplied to the audio signal amplification device, the control circuit controls the selection circuit so that the direct current power charged to the first capacitor is selected in the selection circuit and is supplied to the clock generation circuit.

4. The audio signal amplification device according to claim 3, wherein, when the selection circuit is controlled so that the direct current power charged to the first capacitor is selected in the selection circuit and is supplied to the clock generation circuit, the control circuit controls the constant voltage generation circuit so that an operation of the constant voltage generation circuit is stopped.

5. The audio signal amplification device according to claim 3, wherein, when the selection circuit is controlled so that the direct current power charged to the first capacitor is selected in the selection circuit and is supplied to the clock generation circuit, the control circuit controls the first charging circuit so that the charge to the first capacitor is stopped.

6. The audio signal amplification device according to claim 2,
 wherein the first charging circuit charges the first capacitor while switching two types of charging modes in which charging speeds are different from each other, and
 after the power is supplied to the audio signal amplification device, the control circuit controls the first charging circuit so that the first capacitor is charged in the charging mode in which the charging speed is slower.

7. The audio signal amplification device according to claim 6, wherein the control circuit controls the first charging circuit so that the first capacitor is charged in the charging mode in which the charging speed is slower during a period since the power is supplied to the audio signal amplification device until the charging voltage of the first capacitor reaches a predetermined first threshold value, that the first capacitor is charged in the charging mode in which the charging speed is faster during a period since the charging voltage of the first capacitor has become the first threshold value or more until the charging voltage of the first capacitor reaches a second threshold value numerically larger than the first threshold value, and that the charge to the first capacitor is stopped when the charging voltage of the first capacitor has become the second threshold value or more.

8. The audio signal amplification device according to claim 7, wherein the control circuit controls the first charging circuit so that the first capacitor is charged by the first charging circuit when the charging voltage of the first capacitor is equal to or less than a third threshold value numerically larger than the first threshold value and numerically smaller than the second threshold value, and when the audio signal has become a signal indicating silence.

9. The audio signal amplification device according to claim 7, wherein, when the charging voltage of the first capacitor has become equal to or less than a fourth threshold value numerically smaller than the first threshold value, the control circuit controls the first charging circuit so that the first capacitor is charged by the first charging circuit.

10. The audio signal amplification device according to claim 2,
 wherein the power supply circuit further includes:
  a second capacitor; and
  a second charging circuit that charges the second capacitor by using the input power,
 the selection circuit selects one direct current power among the direct current power generated in the constant voltage generation circuit, the direct current power charged to the first capacitor, and direct current power charged to the second capacitor, and supplies the selected direct current power to the clock generation circuit, and
 when the power is supplied to the audio signal amplification device, the control circuit controls the second charging circuit so that the second capacitor is charged by the second charging circuit, and controls the selection circuit so that the direct current power charged to one capacitor of the first capacitor and the second capacitor, in which a charging voltage reaches a predetermined threshold value, is selected in the selection circuit, and is supplied to the clock generation circuit.

11. The audio signal amplification device according to claim 10, wherein, in a case where a charging voltage of one capacitor of the first capacitor and the second capacitor, the one capacitor being selected in the selection circuit, has become a third threshold value or less and where the audio signal has become a signal indicating silence, or in a case where the charging voltage of the one capacitor has become a fourth threshold value or less, the control circuit controls the selection circuit so that direct current power charged to other capacitor of the first capacitor and the second capacitor is selected in the selection circuit and is supplied to the clock generation circuit, and controls the first charging circuit or the second charging circuit so that the one capacitor is charged by a charging circuit of the first charging circuit and the second charging circuit, the charging circuit being a charging circuit for charging the one capacitor.

* * * * *